(12) United States Patent
Kim

(10) Patent No.: US 6,256,849 B1
(45) Date of Patent: Jul. 10, 2001

(54) METHOD FOR FABRICATING MICROACTUATOR FOR INKJET HEAD

(75) Inventor: Il Kim, Kyungki-Do (KR)

(73) Assignee: Samsung Electro-Mechanics., Ltd., Suwon (KR)

( * ) Notice: Subject to any disclaimer, the term of this patent is extended or adjusted under 35 U.S.C. 154(b) by 0 days.

(21) Appl. No.: 09/215,955

(22) Filed: Dec. 18, 1998

(30) Foreign Application Priority Data

Feb. 19, 1998 (KR) .................................................. 98-5096

(51) Int. Cl.[7] .............................. H04R 17/00; B44C 1/22; B41J 2/045; H01L 41/08
(52) U.S. Cl. ................. 29/25.35; 29/890.1; 29/DIG. 16; 347/68; 347/71; 216/27; 216/54; 216/40; 310/342
(58) Field of Search ............................... 29/890.1, 25.35, 29/424, 885, DIG. 16; 347/68, 70, 71; 216/27, 54, 40, 49; 310/311, 342

(56) References Cited

U.S. PATENT DOCUMENTS

| 5,073,233 | * | 12/1991 | Banks et al. | ............................. | 216/49 |
| 5,344,117 | * | 9/1994 | Trah et al. | ............................... | 347/70 |
| 5,658,469 | * | 8/1997 | Jennison | ................................... | 216/40 |

FOREIGN PATENT DOCUMENTS

| 55-86118 | * | 6/1980 | (JP) | ....................................... | 216/49 |
| 994955 | | 7/1995 | (JP) . | | |
| 10-100405 | | 8/1996 | (JP) . | | |
| 09094955 | | 4/1997 | (JP) . | | |
| 10100405 | | 4/1998 | (JP) . | | |
| 1688113 | * | 10/1991 | (SU) | ..................................... | 29/890.1 |
| WO 93/22140 | * | 11/1993 | (WO) | ..................................... | 29/890.1 |

OTHER PUBLICATIONS

Zheng et al., Low Cost Fabrication of Micromechanical Systems, Microelectronic Engineering, vol. 35, Issue 1–4, pp. 389–392, Feb. 1997.*
Patent Abstracts of Japan of JP 09094955 of Apr. 1997.
Patent Abstracts of Japan of JP 10100405 of Apr. 1998.

* cited by examiner

Primary Examiner—Gregory L. Huson
Assistant Examiner—A. Dexter Tugbang
(74) Attorney, Agent, or Firm—Ladas and Parry

(57) ABSTRACT

A method for fabricating a microactuator for an inkjet head, which achieves easy formation of oxide piezoelectric elements and upper electrodes having desired patterns, using a patterning process mainly used in the fabrication of semiconductor devices. The method includes the steps of sequentially laminating a vibrating plate, a lower electrode, an oxide piezoelectric sheet, and an electrode layer, patterning the electrode layer, thereby forming upper electrodes of a desired pattern, and patterning the oxide piezoelectric sheet in accordance with an etching process while using the upper electrodes as a mask, thereby forming oxide piezoelectric elements of a desired pattern. Alternatively, the method includes the steps of sequentially laminating a lower electrode and an oxide piezoelectric sheet over a vibrating plate, patterning the oxide piezoelectric sheet in accordance with an etching process, thereby forming oxide piezoelectric elements of a desired pattern, depositing an electrode layer over the resulting structure, and patterning the electrode layer while using the piezoelectric elements as a mask, thereby forming upper electrodes of a desired pattern.

8 Claims, 24 Drawing Sheets

METHOD FOR FABRICATING MICROACTUATOR FOR INKJET HEAD

BACKGROUND OF THE INVENTION

1. Field of the Invention

The present invention relates to a method for fabricating a microactuator for an inkjet head, and more particularly to a method for fabricating such a microactuator, which achieves an easy formation of oxide piezoelectric elements having a desired pattern, using a patterning process mainly used in the fabrication of semiconductor devices.

2. Description of the Prior Art

Generally, microactuators, which are used for inkjet heads, include an actuating means for squirting or firing ink. For such an actuating means, heaters and piezoelectric elements are mainly used.

In the case of microactuators using piezoelectric elements, a PZT, which is an oxide piezoelectric material exhibiting a strong piezoelectric property, is mainly used for those piezoelectric elements.

Referring to FIG. 16, a conventional microactuator using such a PZT is illustrated. As shown in FIG. 16, the microactuator includes a PZT element 30 attached with lower and upper electrodes 20 and 40 at lower and upper surfaces thereof, respectively. A vibrating plate 10 is attached to a surface of the lower electrode 20 opposite to the PZT element 30. The vibrating plate 10 is operatively coupled to the PZT element 30 so that it generates a mechanical deformation.

A chamber plate 50, which has a plurality of solution chambers 51, is attached to the vibrating plate 10 opposite to the PZT element 30. As the vibrating plate 10 is bent, ink is introduced into the solution chambers 51. Subsequently, the ink is outwardly squirted from the solution chambers 51 via nozzles (not shown).

The microactuator, which has the above mentioned structure including the PZT element 30, the lower and upper electrodes 20 and 40, and the vibrating plate 10, is typically fabricated using the following screen printing process or other simple bonding process.

In accordance with the screen printing process, a thin green sheet made of an oxide piezoelectric material, for example, a zirconium oxide ($ZrO_2$), is first prepared. The green sheet is baked at a high temperature of at least about 1,000° C., thereby forming a ceramic thin plate from which a vibrating plate 10 is, in turn, prepared. After the preparation of the vibrating plate 10, a conductive material such as platinum (Pt) is deposited to a thickness of 20 $\mu$m or less on a desired portion of the vibrating plate 10, thereby forming a lower electrode 20.

PZT is then coated in a paste state over the upper surface of the lower electrode 20. An accurate lamination of the coated PZT is then conducted using a screen printing process, thereby forming a PZT layer having a very small thickness. The PZT layer is subsequently baked at a high temperature of about 1,000° C. or less, thereby forming a PZT element 30.

Thereafter, gold (Au) is coated over the upper surface of the PZT element 30, thereby forming an upper electrode 40. Thus, a microactuator is produced.

In the case of such a microactuator having the above mentioned structure, the PZT element 30 expands and contracts longitudinally as high voltage is intermittently applied between the lower and upper electrodes 20 and 40, thereby causing the vibrating plate 10 to generate a mechanical deformation thereof. By such a mechanical deformation of the vibrating plate 10, a variation in volume occurs in the solution chamber 51 of the chamber plate 50 attached to the vibrating plate 10. As a result, ink is introduced into and outwardly squirted from the solution chambers 51.

The vibrating plate 10 may also be comprised of a stainless steel thin plate, in place of the ceramic thin plate. Where the vibrating plate 10 is comprised of such a metal thin plate, PZT elements are separately fabricated. In this case, a PZT sheet is bonded to the vibrating plate by means of an adhesive. The bonded PZT sheet is mechanically processed to form PZT elements of a desired pattern. Otherwise, a PZT sheet prepared to have a desired size is bonded to a stainless steel thin plate by means of an adhesive while being patterned on the stainless steel thin plate, thereby forming PZT elements of a desired pattern.

In the case of fabricating a microactuator using a ceramic thin plate as its vibrating plate, however, it is very difficult to form a vibrating plate having a desired thickness and an accurate size, using a zirconium oxide paste. Furthermore, there are difficulties due to a very high baking temperature used.

It is also difficult to form PZT elements of an accurate pattern by laminating and patterning a PZT paste on the vibrating plate in accordance with the screen printing process. In particular, the patterning process is conducted with a greatly degraded accuracy. Furthermore, a high baking temperature is required for the PZT paste, even though it is lower than that for the vibrating plate. Since such a PZT paste is typically baked at a temperature of about 900° C. or less, there is a great degradation in the piezoelectric performance of the resulting PZT elements.

In the case of fabricating a microactuator using a metal thin plate, for example, a stainless steel thin plate, as its vibrating plate, the mechanical patterning process conducted to pattern a PZT sheet bonded to the stainless steel thin plate exhibits a very low accuracy. For this reason, there is dissatisfaction in terms of reliability and economical purposes. Where a PZT sheet prepared to have a desired size is bonded to the metal thin plate, a reduction in the yield of the resulting microactuator occurs. As a result, there is a degradation in the operating efficiency of the microactuator.

SUMMARY OF THE INVENTION

Therefore, an object of the invention is to provide a method for fabricating a microactuator, which is capable of achieving an easy fabrication of microactuators by forming oxide piezoelectric elements of a desired pattern and upper electrodes of a desired pattern by use of an etching process.

Another object of the invention is to provide a method for fabricating a microactuator, which is capable of forming oxide piezoelectric elements of a desired pattern and upper electrodes of a desired pattern without using any expensive patterning equipment, thereby achieving a reduction in the manufacturing costs.

Another object of the invention is to provide a method for fabricating a microactuator, which is capable of simultaneously fabricating a plurality of microactuators through processes required for the fabrication of a single microactuator, thereby providing an advantage in terms of mass production.

In accordance with one aspect, the present invention provides a method for fabricating a microactuator comprising the steps of sequentially laminating a vibrating plate, a lower electrode, an oxide piezoelectric sheet, and an electrode layer, patterning the electrode layer in accordance with an etching process, thereby forming upper electrodes of a desired pattern, and patterning the oxide piezoelectric sheet in accordance with an etching process while using the upper electrodes as a mask, thereby forming oxide piezoelectric elements of a desired pattern. Alternatively, the electrode layer may be deposited over the oxide piezoelectric sheet in the form of upper electrodes having a desired pattern.

In accordance with another aspect, the present invention provides a method for fabricating a microactuator comprising the steps of sequentially laminating a lower electrode and an oxide piezoelectric sheet over a vibrating plate, patterning the oxide piezoelectric sheet in accordance with an etching process, thereby forming oxide piezoelectric elements of a desired pattern, depositing an electrode layer over the resulting structure, and patterning the electrode layer while using the piezoelectric elements as a mask, thereby forming upper electrodes of a desired pattern. Alternatively, the electrode layer may be deposited over the oxide piezoelectric sheet in the form of upper electrodes having a desired pattern.

In accordance with the present invention, the formation of oxide piezoelectric elements and upper electrodes, which are disposed on a vibrating plate or lower electrode, is achieved in accordance with a chemical method. Accordingly, a plurality of oxide piezoelectric elements and a plurality of upper electrodes can be formed in a simultaneous manner, respectively. Thus, there is an improvement in terms of productivity and economical purposes.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

FIGS. 1A to 1I are cross-sectional views respectively illustrating a method for fabricating a microactuator in accordance with a first embodiment of the present invention.

Figure 1A:
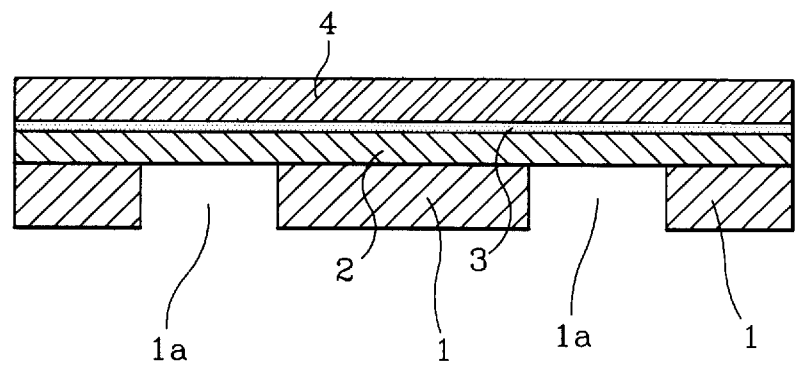
FIGS. 1A to 1I are cross-sectional views respectively illustrating sequential processing steps of a method for fabricating a microactuator in accordance with a first embodiment of the present invention.

Referring to FIG. 1A, a lower electrode 3 and an oxide piezoelectric sheet 4 are illustrated which are sequentially laminated over a vibrating plate 2 formed integrally with a chamber plate 1. The chamber plate 1 has a plurality of uniformly spaced solution chambers 1a.

Figure 1B:
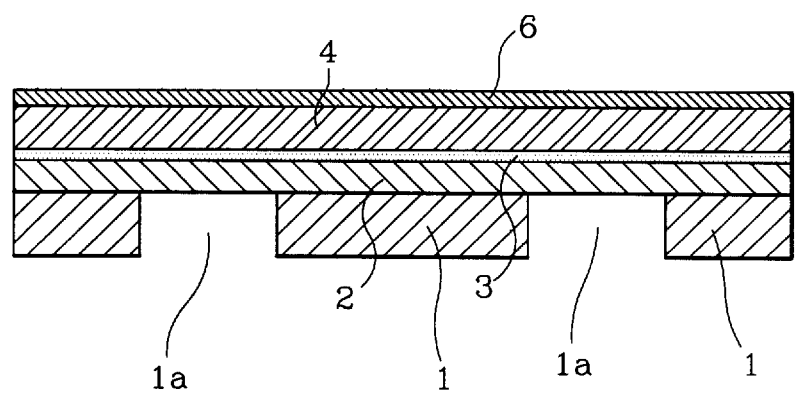
Figure 1C:
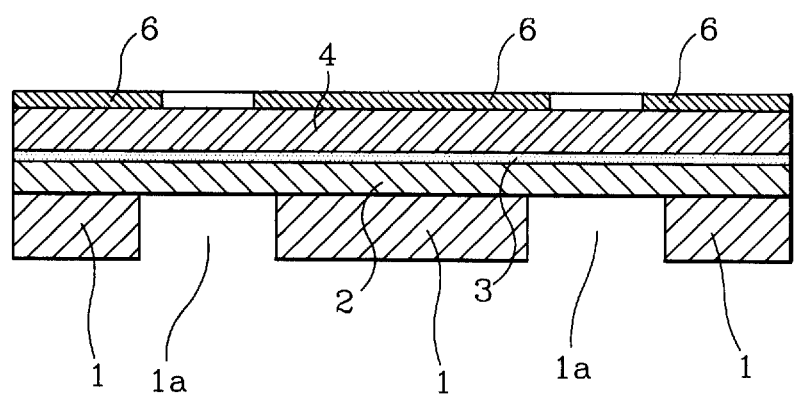

In accordance with this method, a photoresist film 6 is coated over the upper surface of the oxide piezoelectric sheet 4, as shown in FIG. 1B. The photoresist film 6 is then subjected to a soft baking process. After completing the soft baking process, the photoresist film 6 is exposed to light by use of a mask having a desired pattern and then developed, thereby removing unnecessary portions thereof. The resulting structure obtained after partially removing the photoresist film 6 is shown in FIG. 1C.

Figure 1D:
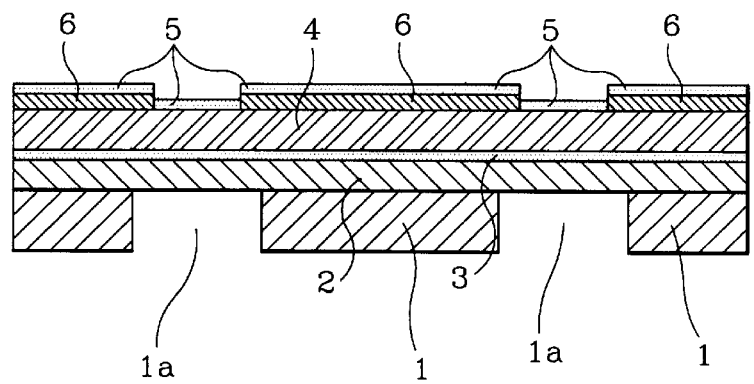

The photoresist film 6 is then subjected to a hard baking process. Thereafter, an electrode layer 5 is coated to a desired thickness over the entire upper surface of the resulting structure including the upper surface of the oxide piezoelectric sheet 4 not covered with the remaining photoresist film 6 and the upper portion of the remaining photoresist film 6, as shown in FIG. 1D.

At this time, the electrode layer 5 is not coated on opposite side surfaces of respective trenches formed due to the partial removal of the photoresist film 6. This is because the upper surface of the structure, over which the electrode layer 5 is to be coated, has a certain topology resulting from the formation of the trenches. As a result, the photoresist film 6 has exposed portions not covered with the electrode layer 5 at side surfaces thereof corresponding to opposite side surfaces of each trench.

When a rinsing solution is downwardly injected toward the electrode layer 5, it penetrates the exposed portions of the photoresist film 6, thereby completely removing the remaining photoresist film 6.

Figure 1E:
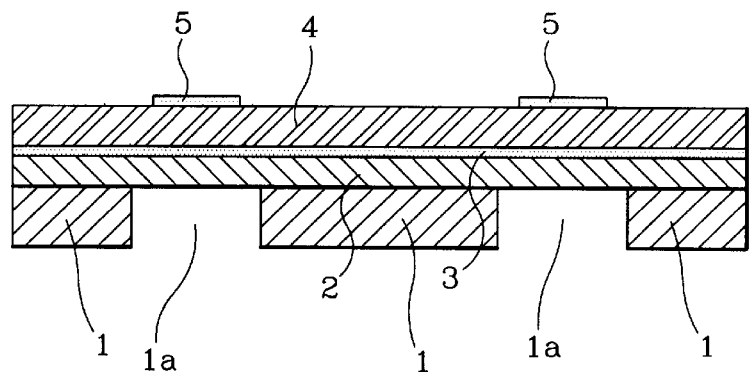

At this time, the portion of the electrode layer 5 coated over the photoresist film 6 is also removed. As a result, the electrode layer 5 is left only on desired portions of the oxide piezoelectric sheet 4, thereby forming upper electrodes, as shown in FIG. 1E.

Figure 1F:
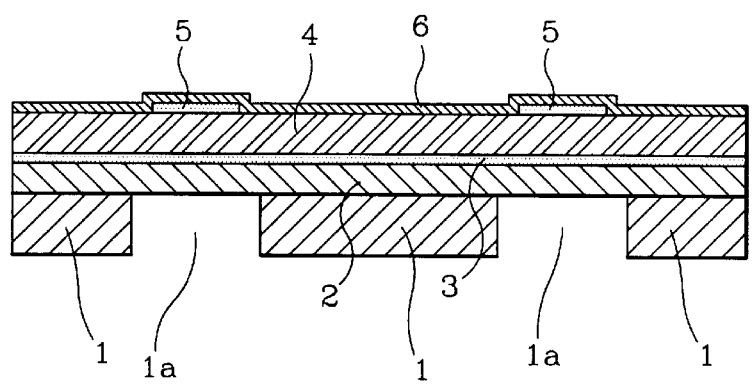

Another photoresist film 6 is then coated over the entire upper surface of the resulting structure including the upper surface of the oxide piezoelectric sheet 4 not covered with the upper electrodes 5 and the upper surfaces of the upper electrodes 5, as shown in FIG. 1F.

Figure 1G:
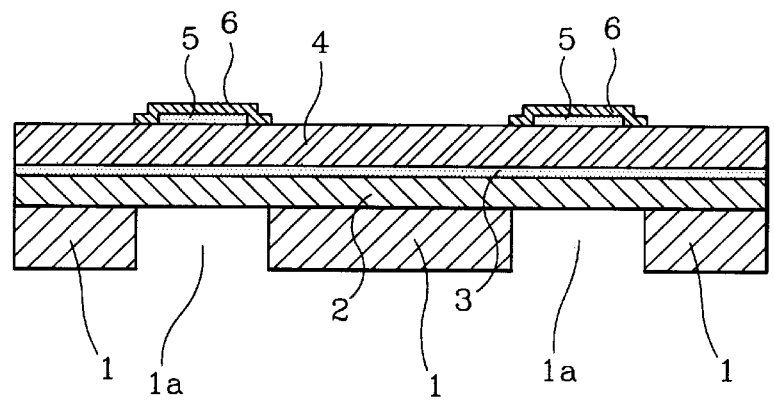
Figure 1H:
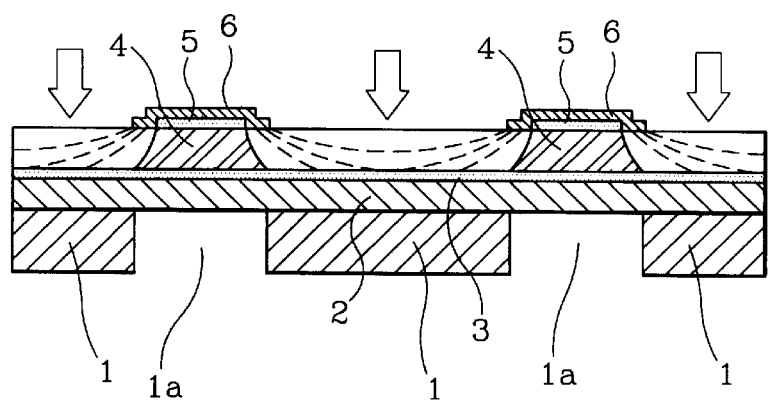

This photoresist film 6 is sequentially subjected to soft baking, light exposure, development, and rinsing processes, thereby removing portions thereof other than the portions covering the upper electrodes 5, as shown in FIG. 1G. Each remaining portion of the photoresist film 6 has a larger surface area than that of an associated one of the upper electrodes 5 because it completely covers the upper electrode 5.

The photoresist film 6 is then hard-baked. Thereafter, the oxide piezoelectric sheet 4 is etched at exposed portions thereof in a direction indicated by the arrows in FIG. 1H, using an etchant, thereby forming oxide piezoelectric elements having a desired pattern. The etching of the oxide piezoelectric sheet 4 proceeds downwardly and laterally as shown by the phantom lines in FIG. 1H, and it is completed on the lower electrode 3 in the downward direction and at positions respectively near opposite lateral ends of each upper electrode 5 in the lateral direction.

In this case, the lower electrode 3 is comprised of an etching stop layer conducting no or very slow reaction with the etchant used to etch the oxide piezoelectric sheet 4.

Where the oxide piezoelectric sheet 4 is patterned to have a desired pattern, using an etching process, as mentioned above, the resulting pattern thereof has a trapezoidal cross-sectional shape increasing in area as extending downwardly, while having an sharp arc shape at opposite side surfaces thereof.

Figure 1I:
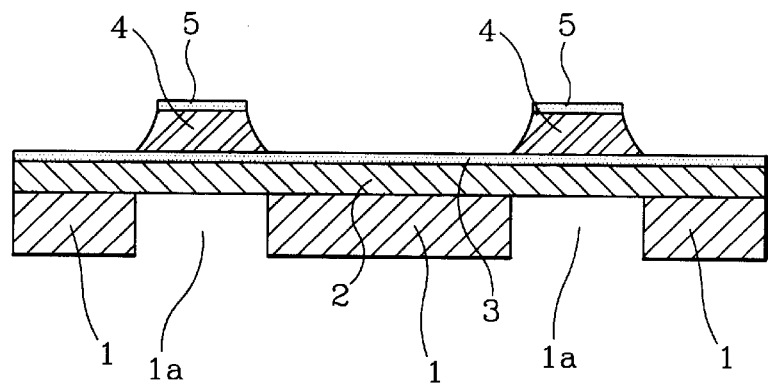

After forming the oxide piezoelectric elements 4 having a desired pattern, using the etching process, the remaining photoresist film 6, which covers the upper electrodes 5, is completely removed using a rinsing solution. Thus, a microactuator having a structure shown in FIG. 1I is produced.

Figure 2A:
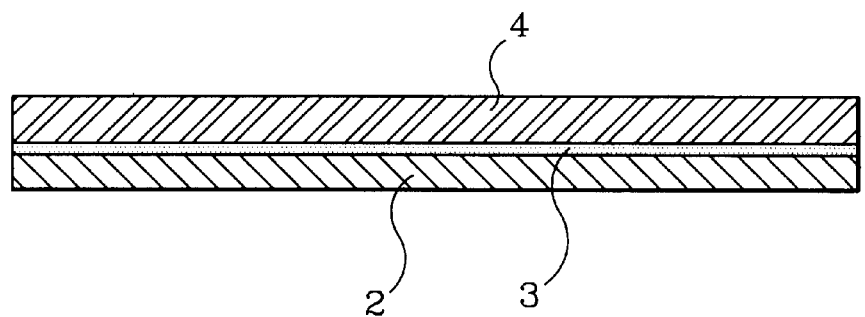
FIGS. 2A and 2B are cross-sectional views respectively illustrating essential processing steps of a method for fabricating a microactuator in accordance with a second embodiment of the present invention.
Figure 2B:
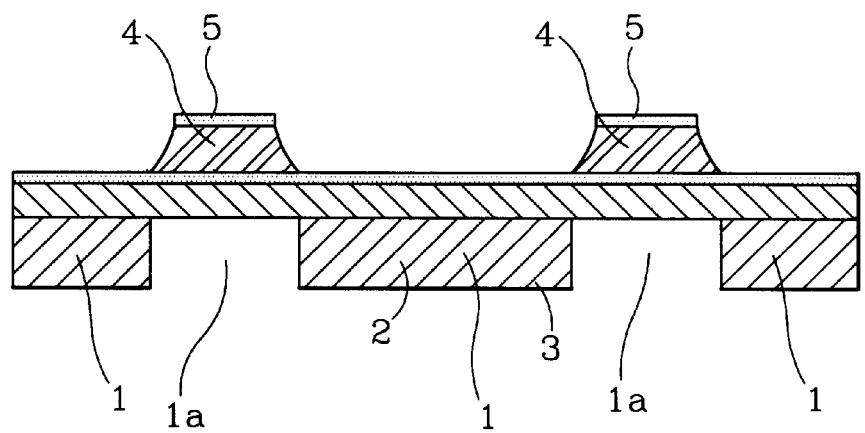

FIGS. 2A and 2B are cross-sectional views respectively illustrating a method for fabricating a microactuator in accordance with a second embodiment of the present invention. In FIGS. 2A and 2B, elements respectively corresponding to those of FIGS. 1A to 1I are denoted by the same reference numerals.

Referring to FIG. 2A, a lower electrode 3 and an oxide piezoelectric sheet 4 are illustrated which are sequentially laminated over a flat vibrating plate 2.

In this embodiment of the present invention, the processing steps of patterning an electrode layer 5 formed on the oxide piezoelectric sheet 4, and patterning the oxide piezoelectric sheet 4 in accordance with an etching process are the same as those in the first embodiment.

The second embodiment is different from the first embodiment in that a chamber plate 1 provided with a plurality of uniformly spaced solution chambers 1a is attached to the lower surface of the vibrating plate 2 just after the patterning of the oxide piezoelectric sheet 4, as shown in FIG. 2B.

Most preferably, the chamber plate 1 is arranged in such a fashion that oxide piezoelectric elements obtained after patterning the oxide piezoelectric sheet 4 are disposed vertically over the solution chambers 1a, respectively.

FIGS. 3A to 3D are cross-sectional views respectively illustrating a method for fabricating a microactuator in accordance with a third embodiment of the present invention. In FIGS. 3A to 3D, elements respectively corresponding to those of FIGS. 1A to 1I are denoted by the same reference numerals.

Figure 3A:
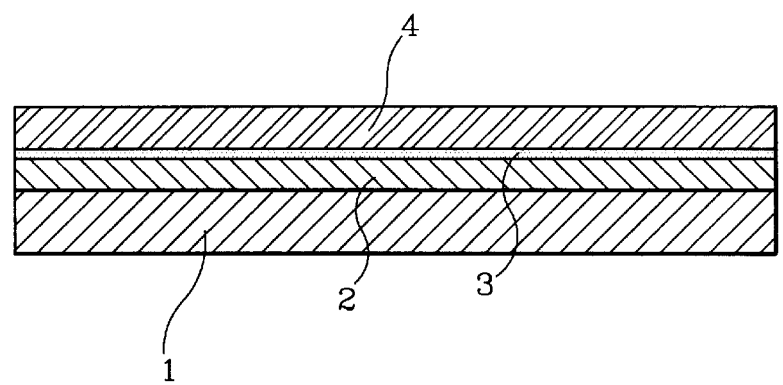
FIGS. 3A to 3D are cross-sectional views respectively illustrating essential processing steps of a method for fabricating a microactuator in accordance with a third embodiment of the present invention.

Referring to FIG. 3A, a lower electrode 3 and an oxide piezoelectric sheet 4 are illustrated which are sequentially laminated over a vibrating plate 2 formed integrally with a chamber plate 1. The chamber plate 1 is in a state in which no solution chamber is formed.

In this embodiment of the present invention, the processing steps of patterning an electrode layer 5 formed on the oxide piezoelectric sheet 4, and patterning the oxide piezoelectric sheet 4 in accordance with an etching process are the same as those in the first and second embodiments.

The third embodiment is different from the first and second embodiments in that the chamber plate 1 is processed to have a plurality of uniformly spaced solution chambers 1a after the patterning of the oxide piezoelectric sheet 4.

Figure 3B:
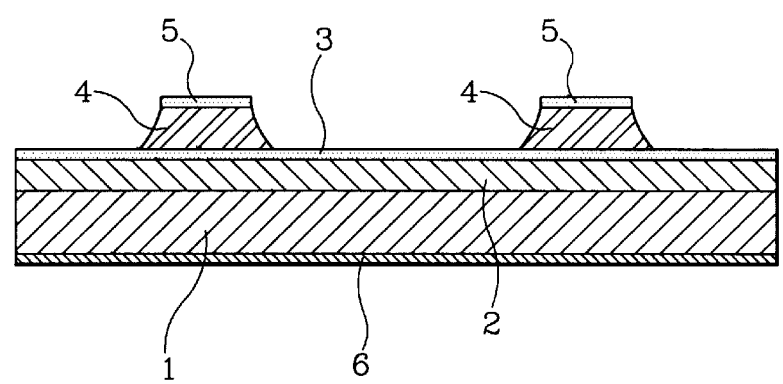
Figure 3C:
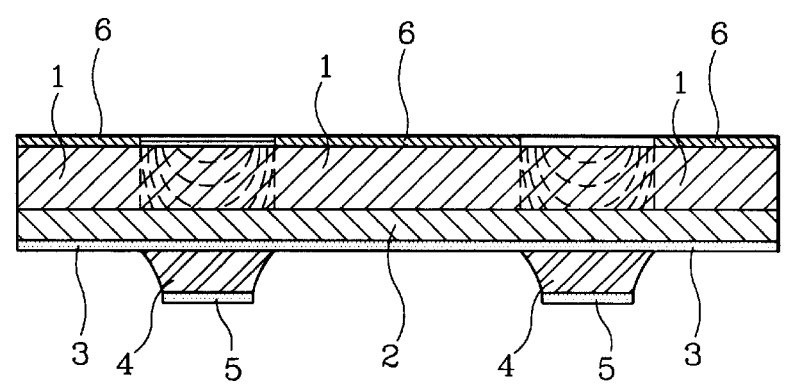

In accordance with this embodiment, a photoresist film 6 is coated over the lower surface of the chamber plate 1, as shown in FIG. 3B. The photoresist film 6 is then subjected to a soft baking process. After completing the soft baking process, the photoresist film 6 is exposed to light by use of a mask having a desired pattern, developed, and then rinsed, thereby removing unnecessary portions thereof. The resulting structure obtained after partially removing the photoresist film 6 is shown in FIG. 3C which is inverted from FIG. 3B.

Figure 3D:
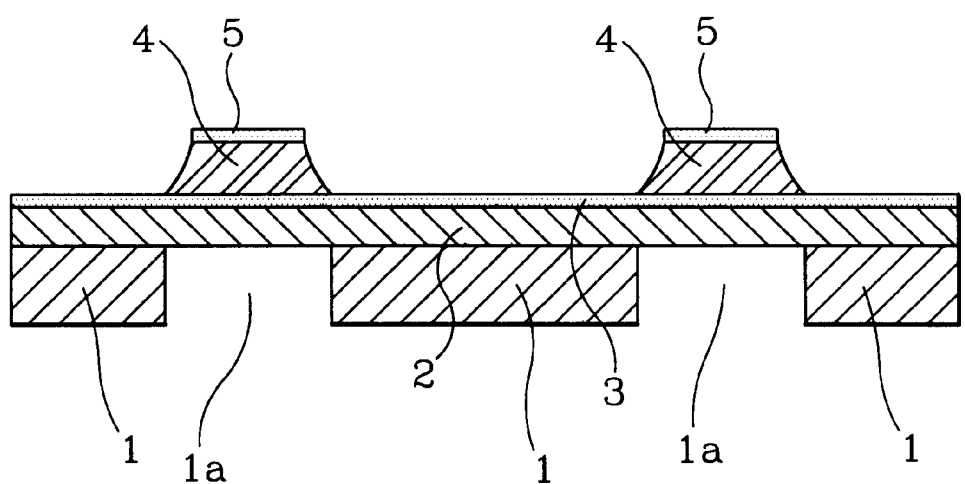

The chamber plate 1 is then etched by an etchant while using the patterned photoresist film 6 as a mask, thereby forming a plurality of uniformly spaced solution chambers 1a in the chamber plate 1, as shown in FIG. 3D.

Thus, the third embodiment of the present invention is characterized in that the formation of the solution chamber 1a is finally conducted by patterning the chamber plate 1. In accordance with such processing steps, a desired microactuator is fabricated.

FIGS. 4A to 4E are cross-sectional views respectively illustrating a method for fabricating a microactuator in accordance with a fourth embodiment of the present invention. In FIGS. 4A to 4E, elements respectively corresponding to those of FIGS. 1A to 1I are denoted by the same reference numerals.

Figure 4A:
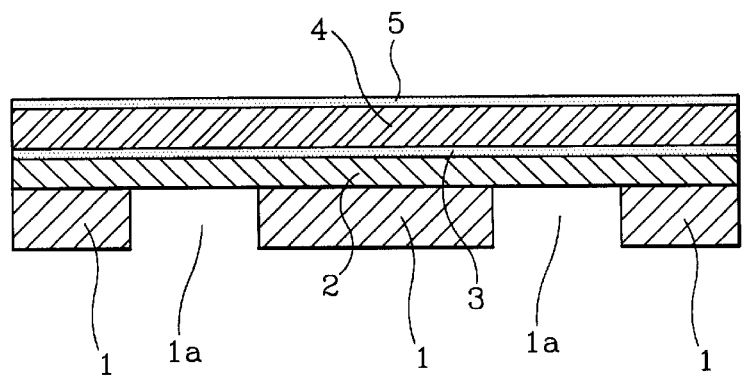
FIGS. 4A to 4E are cross-sectional views respectively illustrating sequential processing steps of a method for fabricating a microactuator in accordance with a fourth embodiment of the present invention.

Referring to FIG. 4A, a lower electrode 3, an oxide piezoelectric sheet 4, and an electrode layer 5 are illustrated which are sequentially laminated over a vibrating plate 2 formed integrally with a chamber plate 1. The chamber plate 1 has a plurality of uniformly spaced solution chambers 1a.

Figure 4B:
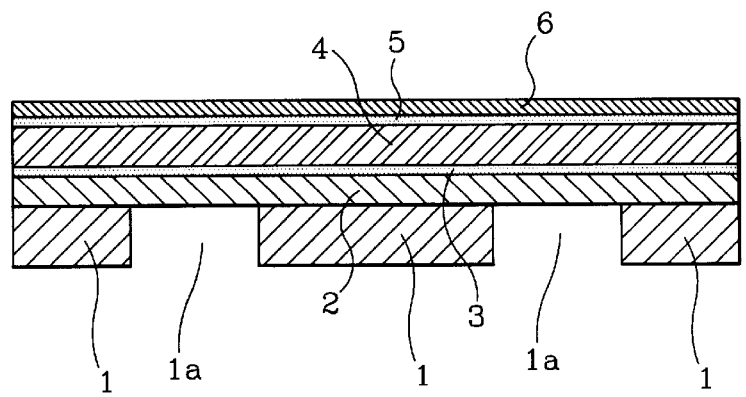
Figure 4C:
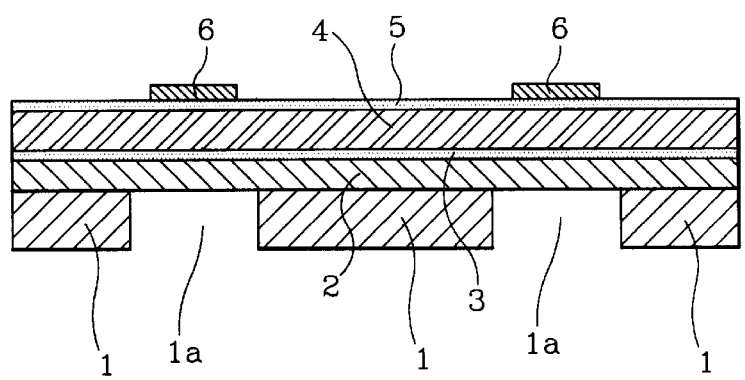
Figure 4D:
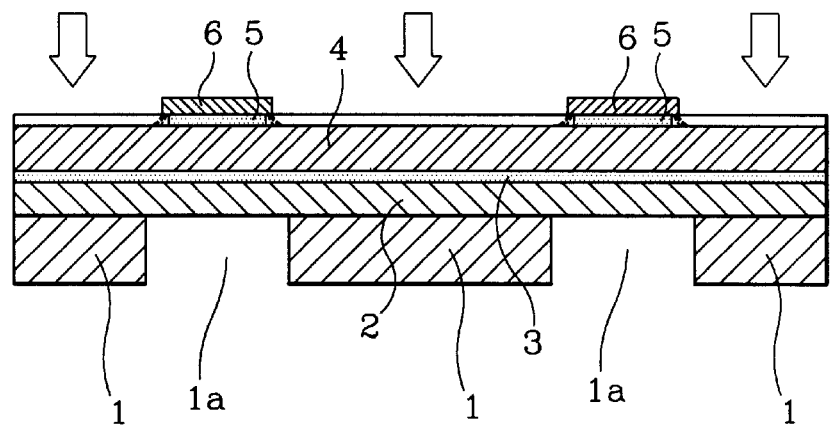

In accordance with this embodiment, a photoresist film 6 is coated over the upper surface of the electrode layer 5, as shown in FIG. 4B. The photoresist film 6 is then subjected to a soft baking process. After completing the soft baking process, the photoresist film 6 is exposed to light, developed, and then rinsed, thereby removing unnecessary portions thereof. The resulting structure obtained after partially removing the photoresist film 6 is shown in FIG. 4C.

It is preferred that the remaining portions of the photoresist film 6 respectively corresponding to upper electrodes to be formed have a larger size than those of the upper electrodes.

After the partial removal of the photoresist film 6, the electrode layer 5 is partially exposed. The electrode layer 5 is then etched at exposed portions thereof in a direction indicated by the arrows in FIG. 4D, using an etchant, thereby forming upper electrodes of a desired pattern.

Figure 4E:
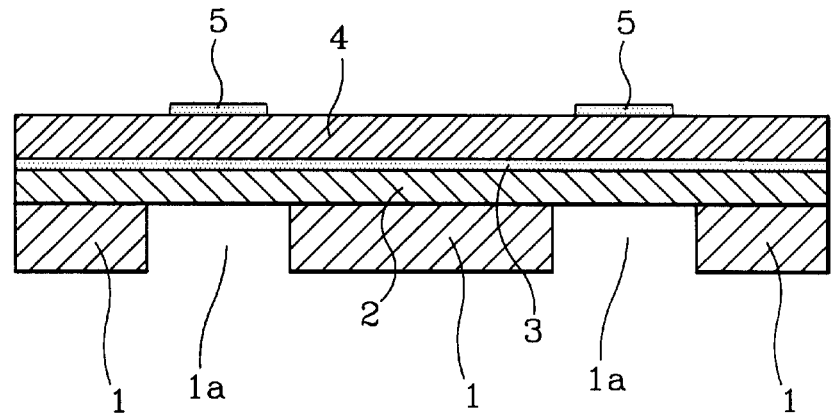

Subsequently, the remaining photoresist film 6, which is left on the patterned upper electrodes 5, is completely removed using a rinsing solution. Thus, only the upper electrodes of a desired pattern are left on the oxide piezoelectric sheet 4, as shown in FIG. 4E.

Meanwhile, the processing steps conducted after the formation of the upper electrodes 5a are the same as those conducted, starting from that of FIG. 1F, in the patterning of the oxide piezoelectric sheet 4 in the case of the first embodiment.

That is, another photoresist film 6 is coated over the entire upper surface of the structure obtained after the formation of the upper electrodes, namely, the exposed upper surface portions of the oxide piezoelectric sheet 4 and the upper surfaces of the upper electrodes 5. This photoresist film 6 is sequentially subjected to soft baking, light exposure, development, and rinsing processes, thereby removing unnecessary portions thereof. The remaining photoresist film 6 is then hard-baked. Thereafter, the oxide piezoelectric sheet 4 is etched at exposed portions thereof, using an etchant, thereby forming oxide piezoelectric elements of a desired pattern. Thus, a microactuator having a desired structure is fabricated.

Figure 5A:
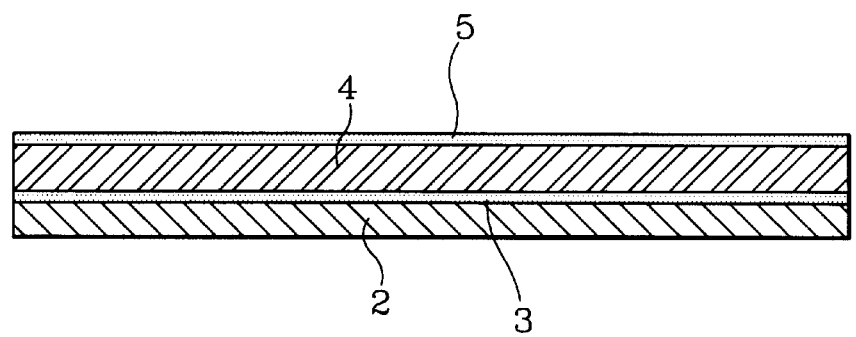
FIGS. 5A and 5B are cross-sectional views respectively illustrating essential processing steps of a method for fabricating a microactuator in accordance with a fifth embodiment of the present invention.
Figure 5B:
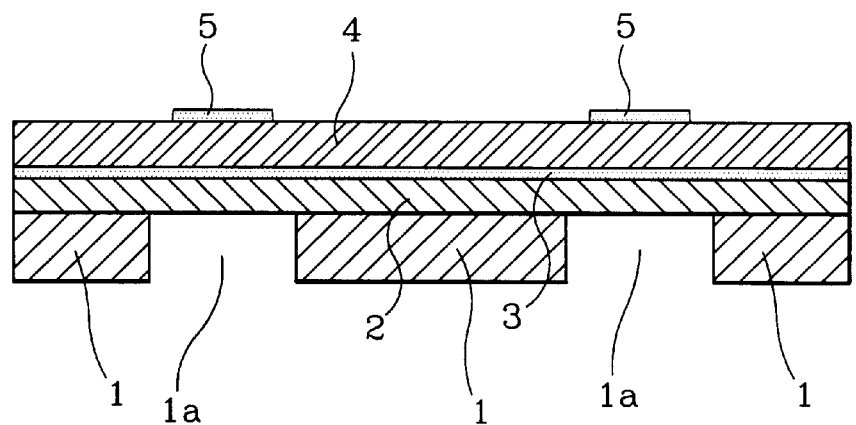

FIGS. 5A and 5B are cross-sectional views respectively illustrating a method for fabricating a microactuator in accordance with a fifth embodiment of the present invention. In FIGS. 5A and 5B, elements respectively corresponding to those of FIGS. 1A to 1I are denoted by the same reference numerals.

Referring to FIG. 5A, a lower electrode 3, an oxide piezoelectric sheet 4, and an electrode layer 5 are illustrated which are sequentially laminated over a flat vibrating plate 2.

In accordance with this embodiment of the present invention, the processing step of patterning the electrode layer 5 is carried out in the same manner as that in the fourth embodiment. That is, a photoresist film 6 is coated over the upper surface of the electrode layer 5. The photoresist film 6 is then subjected to a soft baking process. After completing the soft baking process, the photoresist film 6 is exposed to light, developed, and then rinsed, thereby removing unnecessary portions thereof. The remaining photoresist film 6 is then hard-baked. The electrode layer 5 is then etched at exposed portions thereof, using an etchant, thereby forming upper electrodes of a desired pattern.

Subsequently, the remaining photoresist film 6, which is left on the patterned upper electrodes 5, is rinsed using a rinsing solution, so that it is completely removed. Thus, only the upper electrodes of a desired pattern are left on the osice piezoelectric sheet 4.

Another photoresist film 6 is subsequently coated over the entire upper surface of the resulting structure including the exposed upper surface portions of the oxide piezoelectric sheet 4 and the upper surfaces of the upper electrodes 5. This photoresist film 6 is sequentially subjected to soft baking, light exposure, development, and rinsing processes, thereby removing unnecessary portions thereof.

The remaining photoresist film 6 is then hard-baked. Thereafter, the oxide piezoelectric sheet 4 is etched at exposed portions thereof, using an etchant, thereby forming oxide piezoelectric elements of a desired pattern.

A chamber plate 1, which is previously prepared to have a plurality of uniformly spaced solution chambers 1a, is then attached to the lower surface of the vibrating plate 2, as shown in FIG. 5B. Although not shown, the chamber plate 1 is arranged in such a fashion that the oxide piezoelectric elements are disposed vertically over the solution chambers 1a, respectively. Thus, a microactuator having a desired structure is fabricated.

FIGS. 6A to 6D are cross-sectional views respectively illustrating a method for fabricating a microactuator in accordance with a sixth embodiment of the present invention. In FIGS. 6A to 6D, elements respectively corresponding to those of FIGS. 1A to 1I are denoted by the same reference numerals.

Figure 6A:
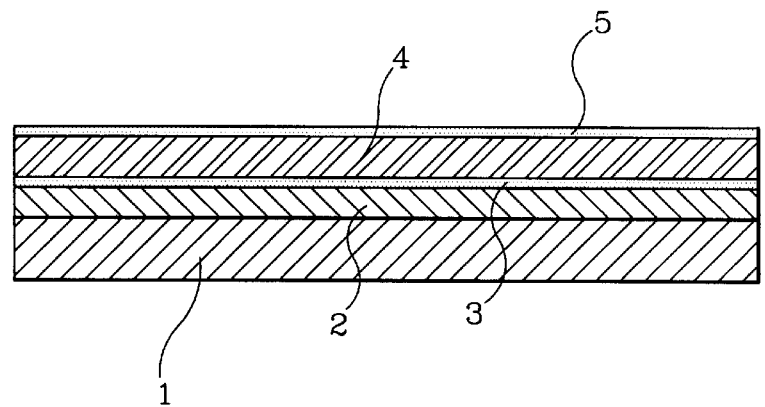
FIGS. 6A to 6D are cross-sectional views respectively illustrating essential processing steps of a method for fabricating a microactuator in accordance with a sixth embodiment of the present invention.

Referring to FIG. 6A, a lower electrode 3, an oxide piezoelectric sheet 4, and an electrode layer 5 are illustrated which are sequentially laminated over a vibrating plate 2 formed integrally with a chamber plate 1. The chamber plate 1 is in a state in which no solution chamber is formed.

In this embodiment of the present invention, the processing steps of patterning the electrode layer 5 and patterning the oxide piezoelectric sheet 4 in accordance with an etching process are the same as those in the fourth and fifth embodiments.

The sixth embodiment is different from the fourth and fifth embodiments in that the chamber plate 1 is processed to have a plurality of uniformly spaced solution chambers 1a after the patterning of the oxide piezoelectric sheet 4.

Figure 6B:
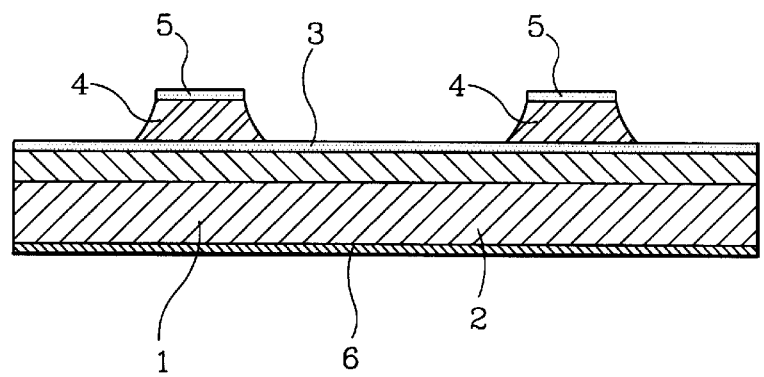
Figure 6C:
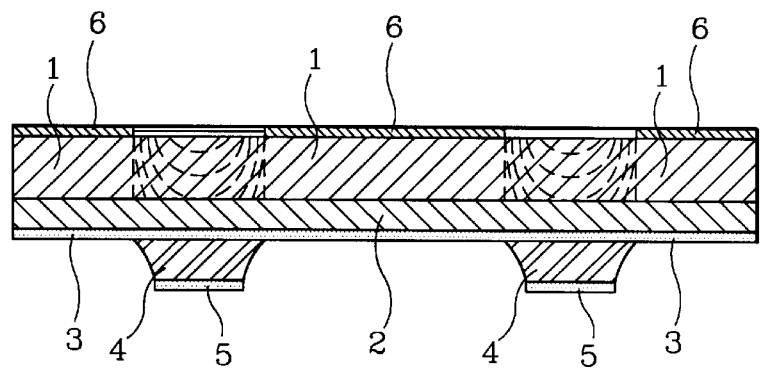

In accordance with this embodiment, a photoresist film 6 is coated over the lower surface of the chamber plate 1 just after the patterning of the oxide piezoelectric sheet 4, as shown in FIG. 6B. The photoresist film 6 is then subjected to a soft baking process. After completing the soft baking process, the photoresist film 6 is exposed to light by use of a mask having a desired pattern, developed, and then rinsed, thereby removing unnecessary portions thereof. The resulting structure obtained after partially removing the photoresist film 6 is shown in FIG. 6C which is inverted from FIG. 6B.

Figure 6D:
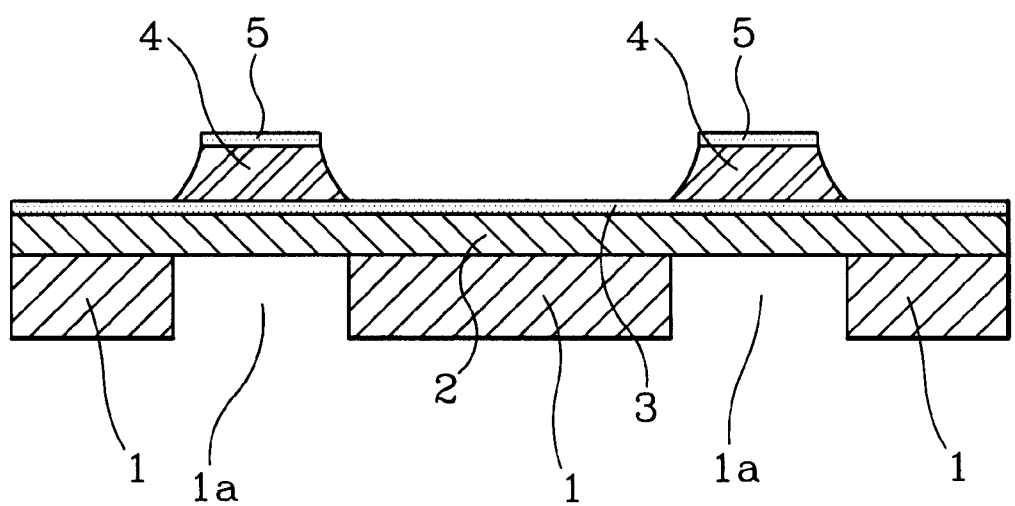

Thereafter, the chamber plate 1 is etched by an etchant while using the patterned photoresist film 6 as a mask, thereby forming a plurality of uniformly spaced solution chambers 1a in the chamber plate 1, as shown in FIG. 6D. Thus, a microactuator having a desired structure is fabricated.

FIGS. 7A to 7I are cross-sectional views respectively illustrating a method for fabricating a microactuator in accordance with a seventh embodiment of the present invention.

Figure 7A:
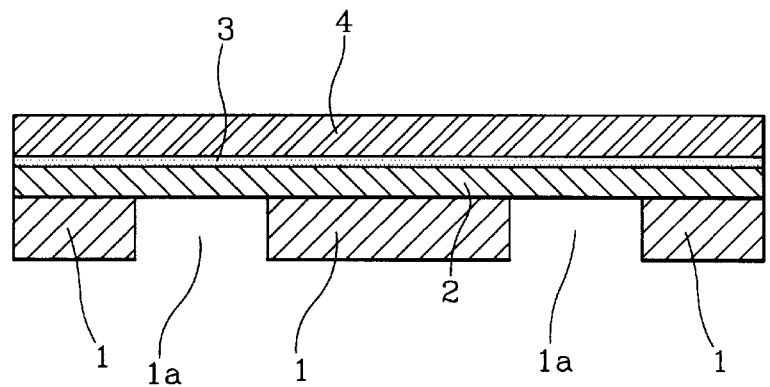
FIGS. 7A to 7I are cross-sectional views respectively illustrating essential processing steps of a method for fabricating a microactuator in accordance with a seventh embodiment of the present invention.

Referring to FIG. 7A, a lower electrode 3 and an oxide piezoelectric sheet 4 are illustrated which are sequentially laminated over a vibrating plate 2 formed integrally with a chamber plate 1. The chamber plate 1 has a plurality of uniformly spaced solution chambers 1a.

Figure 7B:
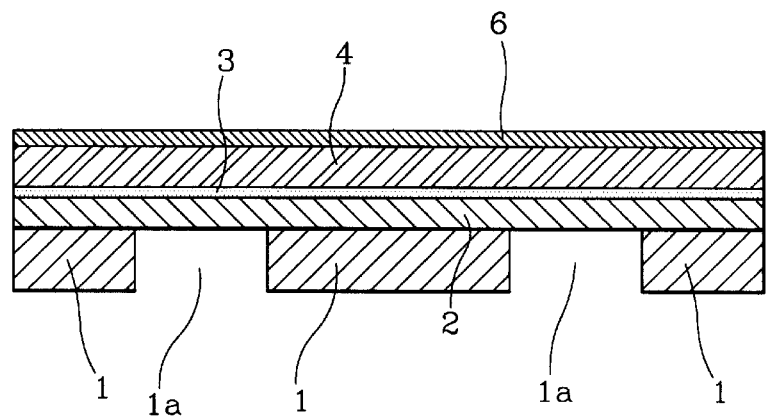
Figure 7C:
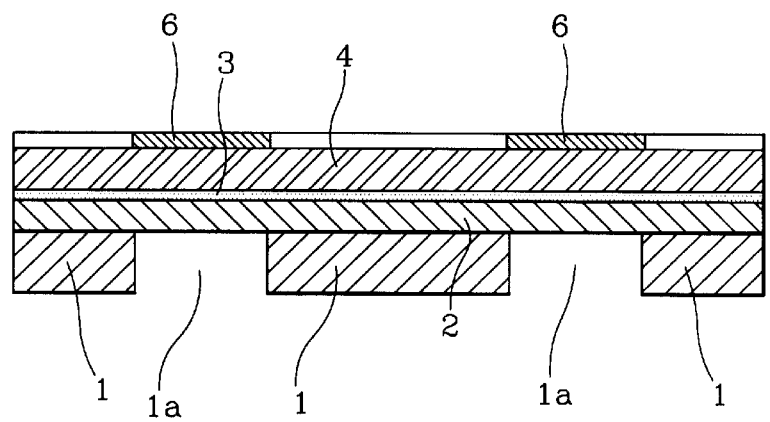

In accordance with this embodiment, a photoresist film 6 is coated to a desired thickness over the upper surface of the oxide piezoelectric sheet 4, as shown in FIG. 7B. The photoresist film 6 is then subjected to a soft baking process. After completing the soft baking process, the photoresist film 6 is exposed to light by use of a mask having a desired pattern, developed, and then rinsed, thereby removing unnecessary portions thereof. The resulting structure obtained after partially removing the photoresist film 6 is shown in FIG. 7C.

The photoresist film 6 is then subjected to a hard baking process. In this case, the remaining portions of the photoresist film 6 respectively corresponding to oxide piezoelectric elements to be formed have a larger size than those of the oxide piezoelectric elements.

Figure 7D:
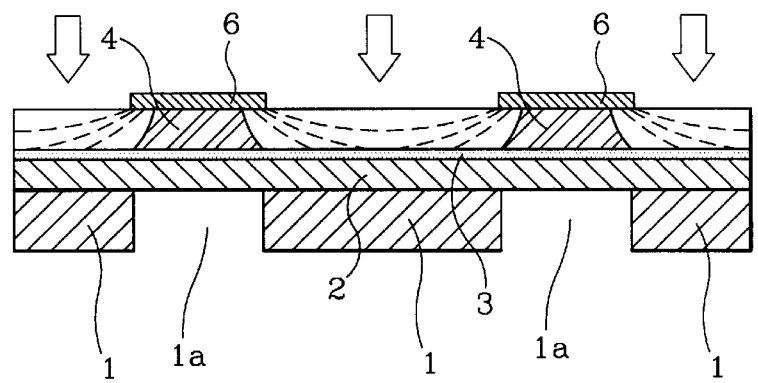

Thereafter, the oxide piezoelectric sheet 4 is etched at exposed portions thereof in a direction indicated by the arrows in FIG. 7D, using an etchant, thereby forming oxide piezoelectric elements of a desired pattern. The etching of the oxide piezoelectric sheet 4 proceeds downwardly and laterally as shown by the phantom lines in FIG. 7D.

Typically, the oxide piezoelectric elements obtained after patterning the oxide piezoelectric sheet 4 have a trapezoidal cross-sectional shape increasing in area as extending downwardly, while having an sharp arc shape at opposite side surfaces thereof.

After forming the oxide piezoelectric elements 4 of a desired pattern in accordance with the etching process, the remaining photoresist film 6, which covers the oxide piezoelectric elements 4, is completely removed using a rinsing solution. The resulting structure, which has the oxide piezoelectric elements 4 of a desired pattern, is illustrated in FIG. 7E.

Figure 7E:
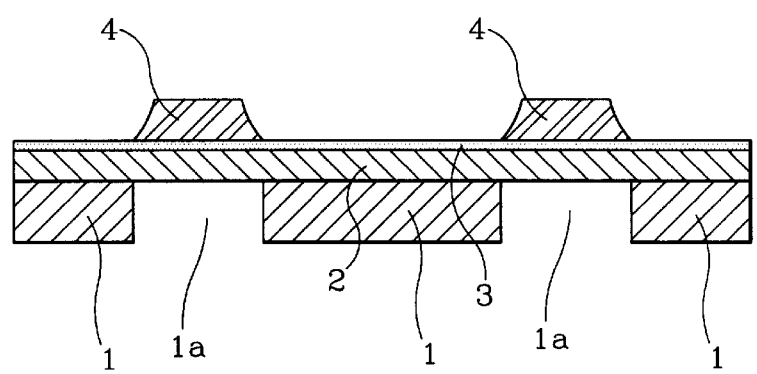
Figure 7F:
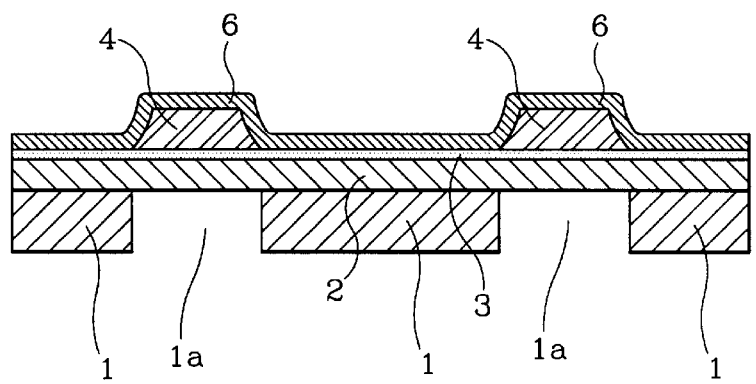

Thereafter, another photoresist film 6 is then coated over the entire upper surface of the structure of FIG. 7E including the exposed upper surface portions of the lower electrode 3 and the upper surfaces of the oxide piezoelectric elements 4, as shown in FIG. 7F.

Preferably, this photoresist film 6 has a thickness greater than that of upper electrodes to be formed on respective oxide piezoelectric elements 4.

Figure 7G:
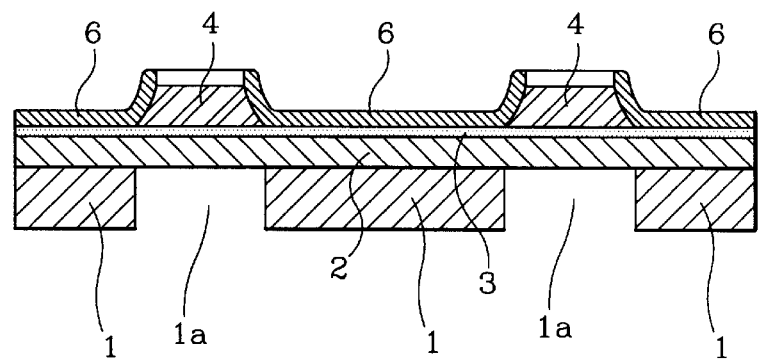

The photoresist film 6 is then subjected to a soft baking process. After completing the soft baking process, the photoresist film 6 is exposed to light by use of a mask capable of providing a desired pattern for upper electrodes. The resulting photoresist film 6 is then developed and rinsed, thereby removing unnecessary portions thereof. The resulting structure is shown in FIG. 7G.

Figure 7H:
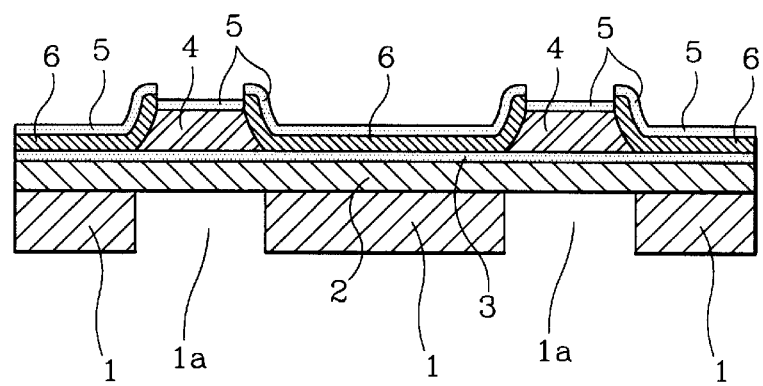

The photoresist film 6 is then hard-baked. Thereafter, an electrode layer 5 is deposited to a uniform thickness over the resulting structure including the upper surface of the remaining photoresist film 6 and the upper surfaces of the oxide piezoelectric elements 4, as shown in FIG. 7H.

In this case, the electrode layer 5 is deposited to have a smaller thickness than that of the photoresist film 6.

Since the upper surface of the structure, over which the electrode layer 5 is to be coated, has a certain topology, the electrode layer 5 is incompletely coated on opposite side surfaces of respective trenches formed due to the partial removal of the photoresist film 6. As a result, the photoresist film 6 has exposed portions not covered with the electrode layer 5 at side surfaces thereof corresponding to opposite side surfaces of each trench.

When the above structure is rinsed, starting from the upper surface of the electrode layer 5, using a rinsing solution, the remaining photoresist film 6, is completely removed, along with the portion of the electrode layer 5 disposed over the photoresist film 6.

Figure 7I:
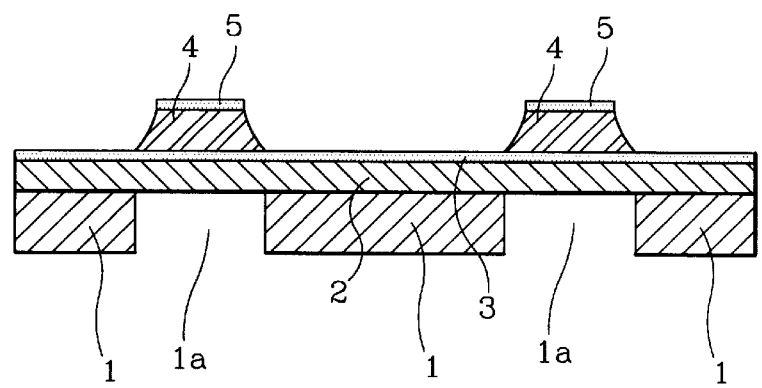

As a result, the electrode layer 5 is left only on the oxide piezoelectric elements 4, thereby forming upper electrodes, as shown in FIG. 7I. Thus, a microactuator having a desired structure is fabricated.

Figure 8A:
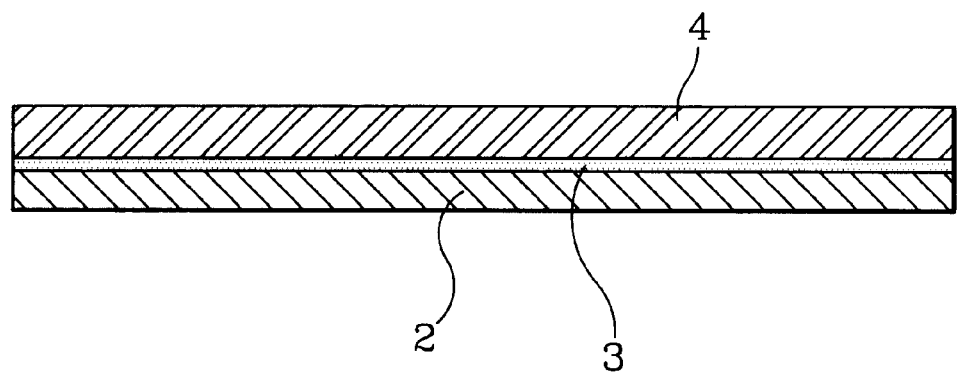
FIGS. 8A and 8B are cross-sectional views respectively illustrating essential processing steps of a method for fabricating a microactuator in accordance with an eighth embodiment of the present invention.
Figure 8B:
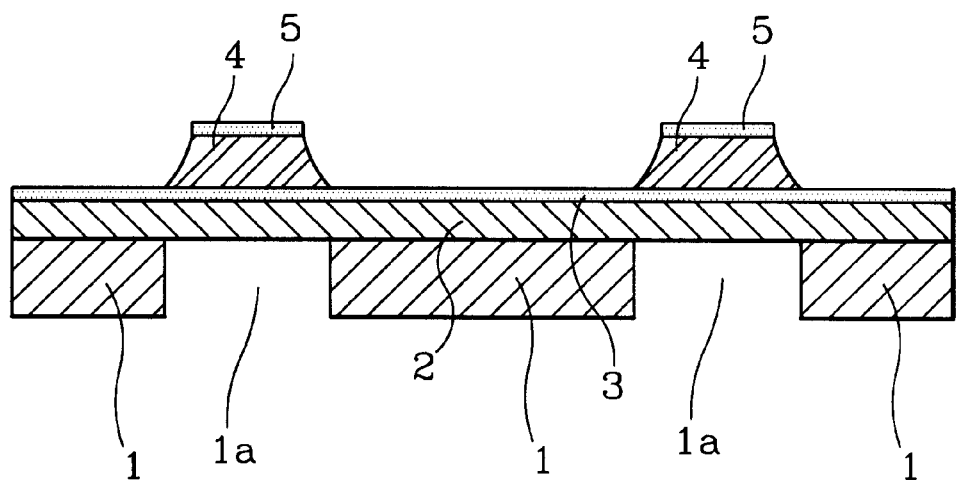

FIGS. 8A and 8B are cross-sectional views respectively illustrating a method for fabricating a microactuator in accordance with an eighth embodiment of the present invention. In FIGS. 8A and 8B, elements respectively corresponding to those of FIGS. 1A to 1I are denoted by the same reference numerals.

Referring to FIG. 8A, a lower electrode 3 and an oxide piezoelectric sheet 4 are illustrated which are sequentially laminated over a flat vibrating plate 2.

In this embodiment of the present invention, the processing steps of patterning the oxide piezoelectric sheet 4 in accordance with an etching process, and forming upper electrodes 5 on oxide piezoelectric elements formed by the patterning of the oxide piezoelectric sheet 4 are the same as those in the seventh embodiment.

In accordance with the eighth embodiment, a chamber plate 1 provided with a plurality of uniformly spaced solution chambers 1a is attached to the lower surface of the vibrating plate 2 is after the formation of the oxide piezoelectric elements 4 and upper electrodes 5, as shown in FIG. 8B. The chamber plate 1 is arranged in such a fashion that the solution chambers 1a thereof are disposed vertically beneath the oxide piezoelectric elements 4, respectively.

FIGS. 9A to 9D are cross-sectional views respectively illustrating a method for fabricating a microactuator in accordance with a ninth embodiment of the present invention. In FIGS. 9A to 9D, elements respectively corresponding to those of FIGS. 1A to 1I are denoted by the same reference numerals.

Figure 9A:
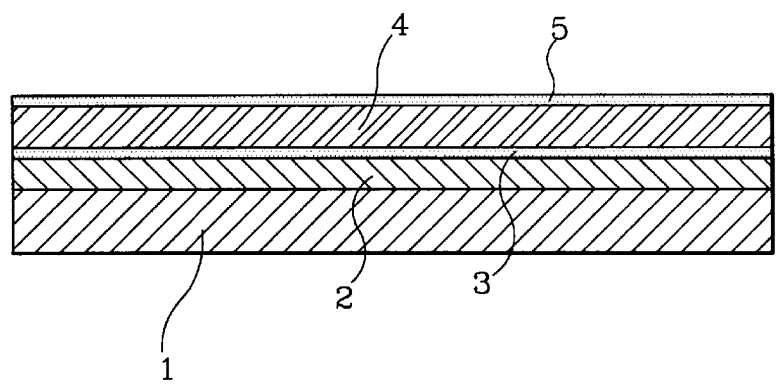
FIGS. 9A to 9D are cross-sectional views respectively illustrating essential processing steps of a method for fabricating a microactuator in accordance with a ninth embodiment of the present invention.

Referring to FIG. 9A, a lower electrode 3, an oxide piezoelectric sheet 4, and an electrode layer 5 are illustrated which are sequentially laminated over a vibrating plate 2 formed integrally with a chamber plate 1. The chamber plate 1 is in a state in which no solution chamber is formed.

In this embodiment of the present invention, the processing steps of patterning the oxide piezoelectric sheet 4 in accordance with an etching process, and forming upper electrodes 5 on oxide piezoelectric elements formed by the patterning of the oxide piezoelectric sheet 4 are the same as those in the seventh and eighth embodiments.

Figure 9B:
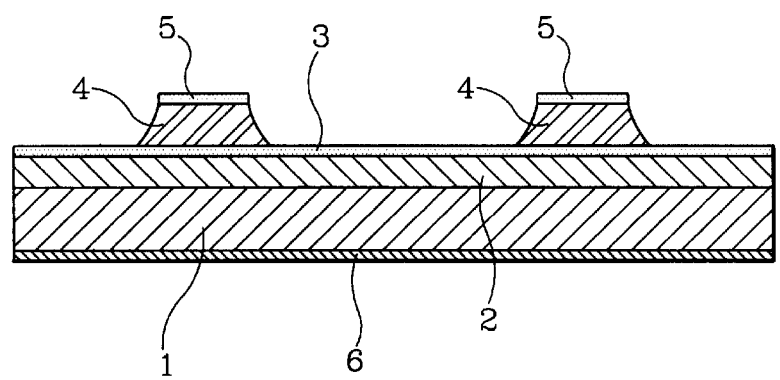
Figure 9C:
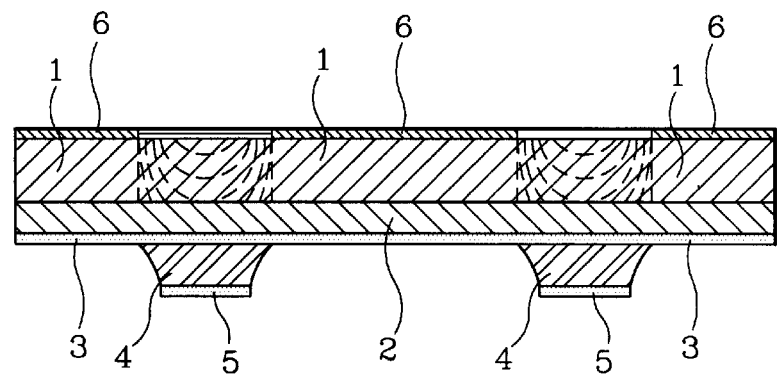

In accordance with this embodiment, a photoresist film 6 is coated over the lower surface of the chamber plate 1 after the formation of the upper electrodes 5, as shown in FIG. 9B. The photoresist film 6 is then subjected to a soft baking process. After completing the soft baking process, the photoresist film 6 is exposed to light by use of a mask, developed, and then rinsed, thereby removing unnecessary portions thereof. The resulting structure obtained after partially removing the photoresist film 6 is shown in FIG. 9C which is inverted from FIG. 9B.

Figure 9D:
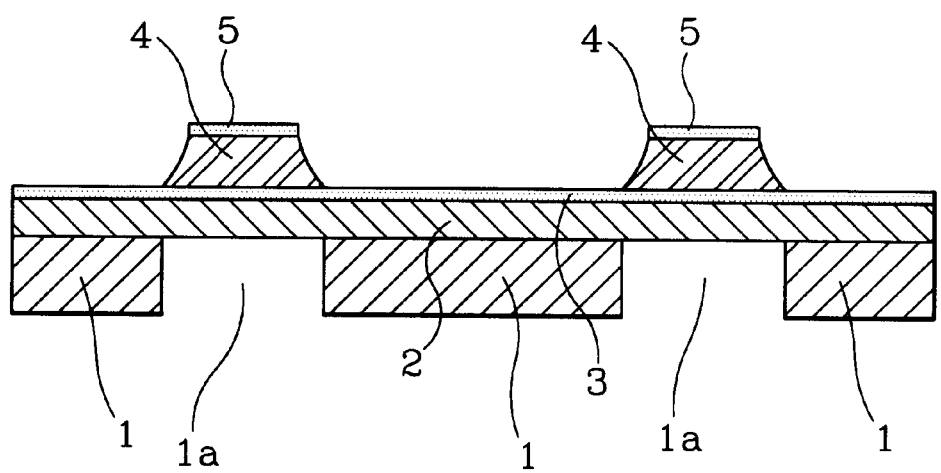

Thereafter, the chamber plate 1 is etched by an etchant while using the patterned photoresist film 6 as a mask, thereby forming a plurality of uniformly spaced solution chambers 1a in the chamber plate 1, as shown in FIG. 9D. Thus, a microactuator having a desired structure is fabricated.

FIGS. 10A to 10F are cross-sectional views respectively illustrating a method for fabricating a microactuator in accordance with a tenth embodiment of the present invention.

Figure 10A:
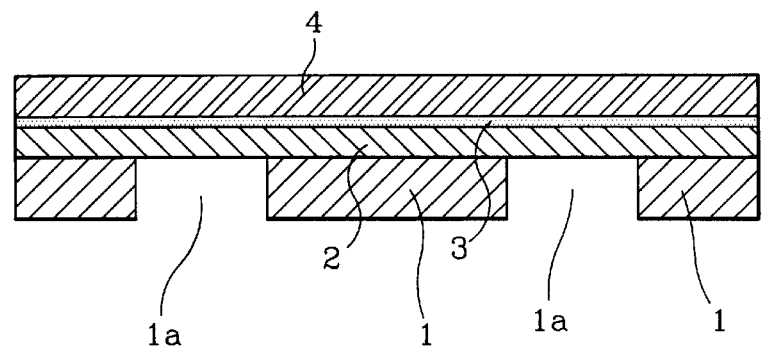
FIGS. 10A to 10F are cross-sectional views respectively illustrating essential processing steps of a method for fabricating a microactuator in accordance with a tenth embodiment of the present invention.

Referring to FIG. 10A, a lower electrode 3 and an oxide piezoelectric sheet 4 are illustrated which are sequentially laminated over a vibrating plate 2 formed integrally with a chamber plate 1. The chamber plate 1 has a plurality of uniformly spaced solution chambers 1a.

In this embodiment of the present invention, the processing step of patterning the oxide piezoelectric sheet 4 in accordance with an etching process is the same as those in the seventh, eighth, and ninth embodiments.

Figure 10B:
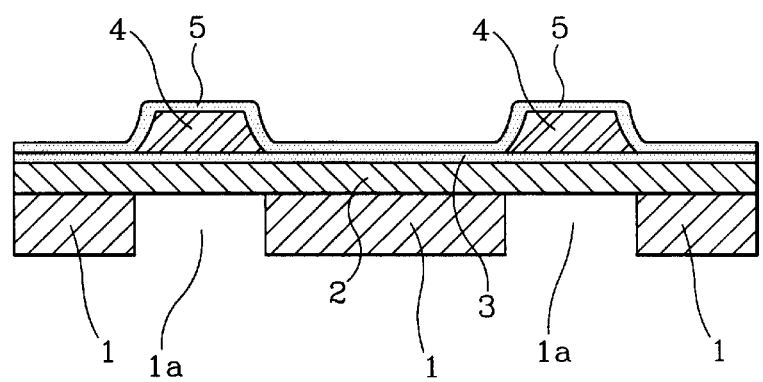

In accordance with the tenth embodiment, an electrode layer 5 is deposited to a desired thickness over the entire upper surface of the structure obtained after the formation of the oxide piezoelectric elements 4, namely, the upper surfaces of the oxide piezoelectric elements 4 and the exposed upper surface portions of the lower electrode 3, as shown in FIG. 10B.

Figure 10C:
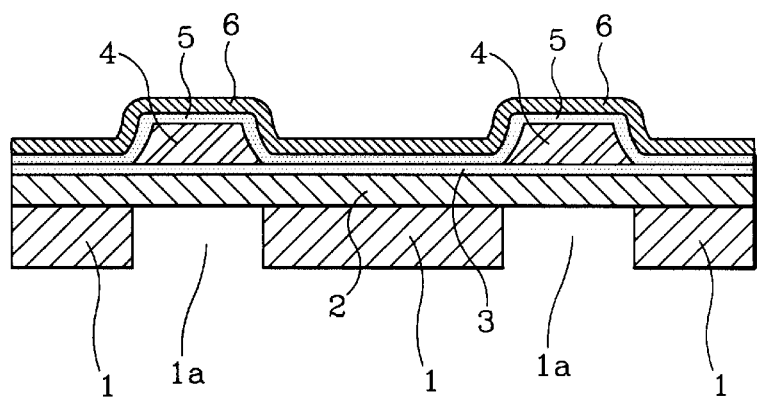
Figure 10D:
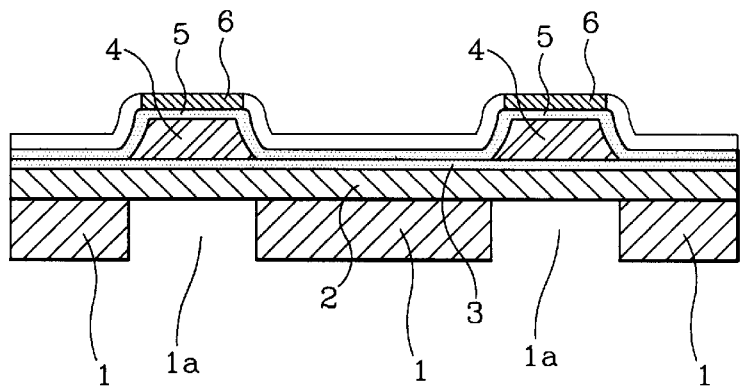
Figure 10E:
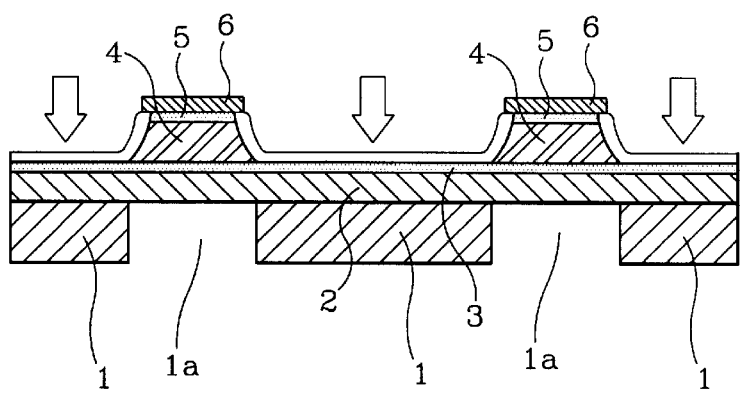

Thereafter, a photoresist film 6 is coated over the electrode layer 5, as shown in FIG. 10C. The photoresist film 6 is then subjected to a soft baking process. After completing the soft baking process, the photoresist film 6 is exposed to light by use of a mask, developed, and then rinsed, thereby removing unnecessary portions thereof. The resulting structure is shown in FIG. 10D.

After the partial removal of the photoresist film 6, the electrode layer 5 is partially exposed. In this state, the electrode layer S is etched at exposed portions thereof in a direction indicated by the arrows in FIG. 10E, using an etchant.

As a result, the electrode layer 5 is left only on the oxide piezoelectric elements 4.

Figure 10F:
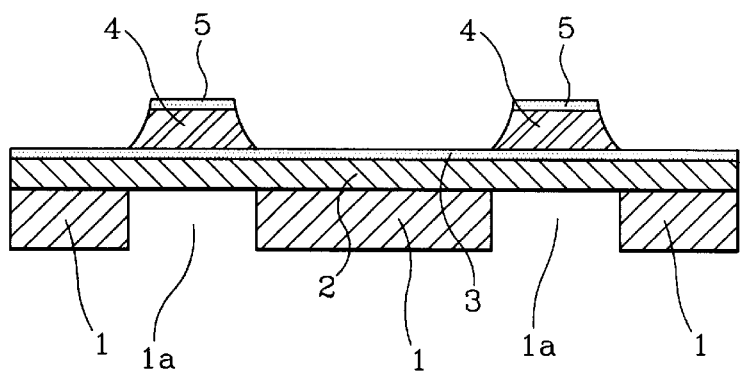

Thus, upper electrodes 5 are formed. Thereafter, the photoresist film 6 left on the upper electrodes 5 is completely removed. As a result, a microactuator having a desired structure is fabricated, as shown in FIG. 10F.

Figure 11A:
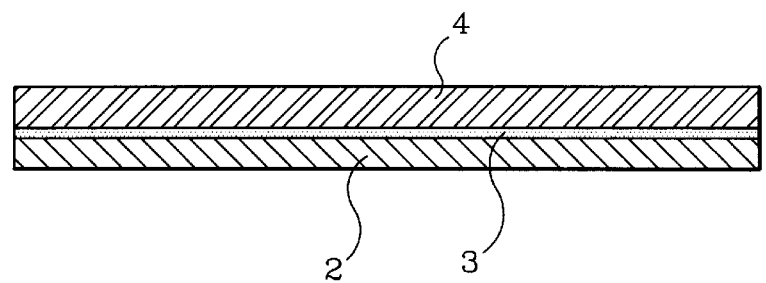
FIGS. 11A to 11C are cross-sectional views respectively illustrating essential processing steps of a method for fabricating a microactuator in accordance with an eleventh embodiment of the present invention.
Figure 11B:
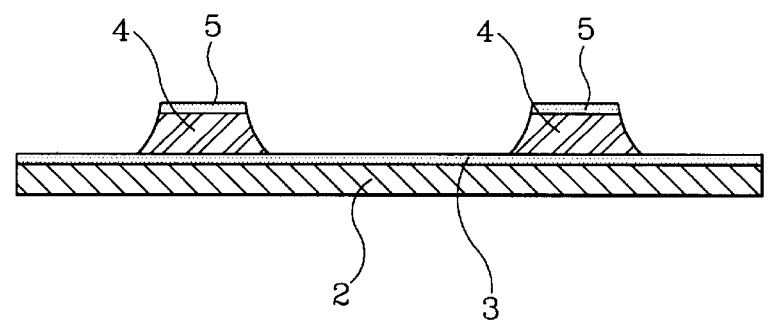
Figure 11C:
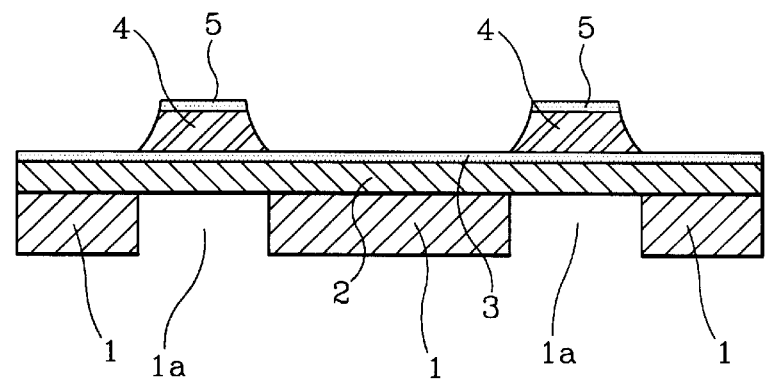

FIGS. 11A to 11C are cross-sectional views respectively illustrating a method for fabricating a microactuator in accordance with an eleventh embodiment of the present invention.

Referring to FIG. 11A, a lower electrode 3 and an oxide piezoelectric sheet 4 are illustrated which are sequentially laminated over a flat vibrating plate 2.

In this embodiment of the present invention, the processing step of patterning the oxide piezoelectric sheet 4 in accordance with an etching process is the same as those in the seventh, eighth, and ninth embodiments.

In accordance with the eleventh embodiment, an electrode layer 5 is deposited to a desired thickness over the entire upper surface of the structure obtained after the formation of the oxide piezoelectric elements 4, namely, the upper surfaces of the oxide piezoelectric elements 4 and the exposed upper surface portions of the lower electrode 3, as in the tenth embodiment. Thereafter, a photoresist film 6 is coated over the electrode layer 5.

Subsequently, the photoresist film 6 is soft-baked, exposed to light by use of a mask, developed, and then rinsed, thereby removing unnecessary portions thereof. The electrode layer 5 is then etched at exposed portions thereof, using an etchant, thereby forming upper electrodes of a desired pattern on the oxide piezoelectric elements 4, as shown in FIG. 11B.

After the formation of the upper electrodes 5, a chamber plate 1, which is previously prepared to have a plurality of uniformly spaced solution chambers 1a, is attached to the lower surface of the vibrating plate 2, as shown in FIG. 11C. The chamber plate 1 is arranged in such a fashion that the solution chambers 1a thereof are disposed vertically beneath the oxide piezoelectric elements 4, respectively.

FIGS. 12A to 12D are cross-sectional views respectively illustrating a method for fabricating a microactuator in accordance with a twelfth embodiment of the present invention. In FIGS. 12A to 12D, elements respectively corresponding to those of FIGS. 1A to 1I are denoted by the same reference numerals.

Figure 12A:
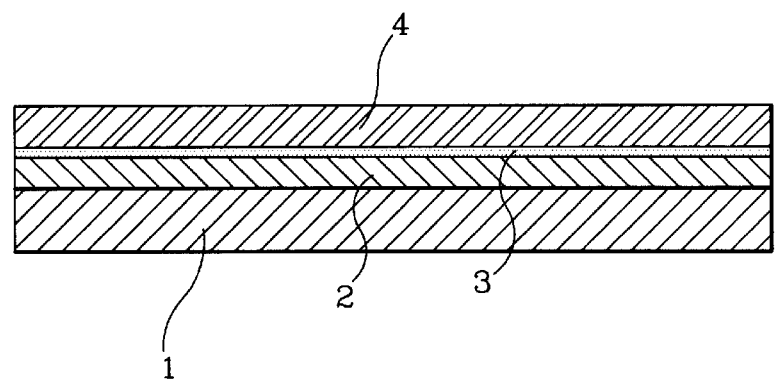
FIGS. 12A to 12D are cross-sectional views respectively illustrating essential processing steps of a method for fabricating a microactuator in accordance with a twelfth embodiment of the present invention.

Referring to FIG. 12A, a lower electrode 3 and an oxide piezoelectric sheet 4 are illustrated which are sequentially laminated over a vibrating plate 2 formed integrally with a chamber plate 1. The chamber plate 1 is in a state in which no solution chamber is formed.

In this embodiment of the present invention, the oxide piezoelectric sheet 4 is first patterned in the same manner as in the seventh, eighth, and ninth embodiments. Thereafter, an electrode layer 5 and a photoresist film (not shown) are sequentially coated over the entire upper surface of the structure obtained after the patterning of the oxide piezoelectric sheet 4, namely, the upper surfaces of oxide piezoelectric elements formed by the patterning of the oxide piezoelectric sheet 4 and the exposed upper surface portions of the lower electrode 3 in the same manner as in the tenth and eleventh embodiments.

In accordance with this embodiment, the photoresist film is then patterned, thereby removing unnecessary portions thereof. Using the patterned photoresist film as a mask, the electrode layer 5 is then etched at exposed portions thereof using an etchant, thereby forming upper electrodes of a desired pattern on the oxide piezoelectric elements 4. In this state, the remaining photoresist 6 is completely removed by a rinsing process.

Figure 12B:
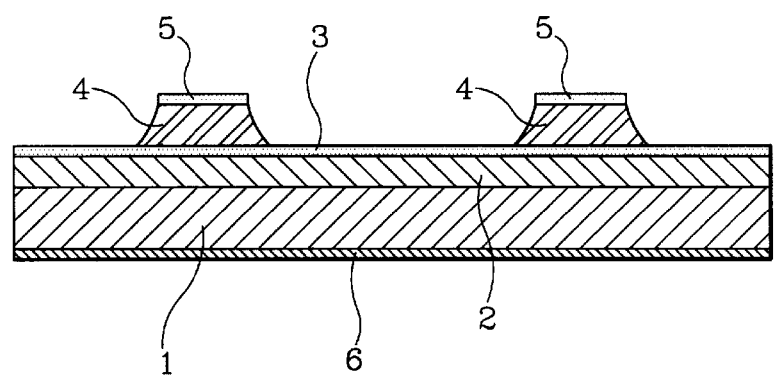
Figure 12C:
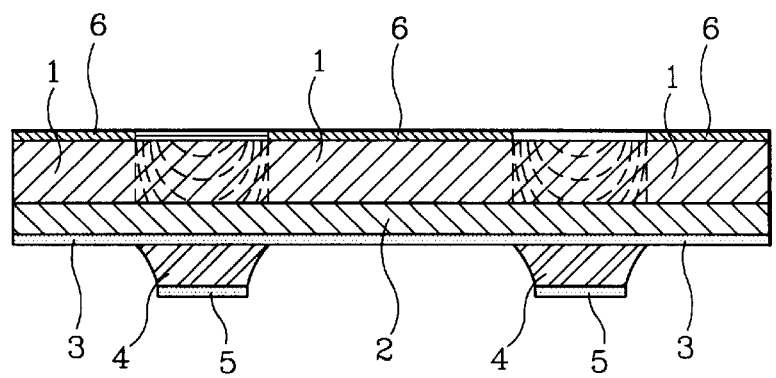

A photoresist film 6 is then coated over the lower surface of the chamber plate 1, as shown in FIG. 12B. The photoresist film 6 is then subjected to a soft baking process. After completing the soft baking process, the photoresist film 6 is exposed to light by use of a mask, developed, and then rinsed, thereby removing unnecessary portions thereof. The resulting structure obtained after partially removing the photoresist film 6 is shown in FIG. 12C which is inverted from FIG. 12B.

Figure 12D:
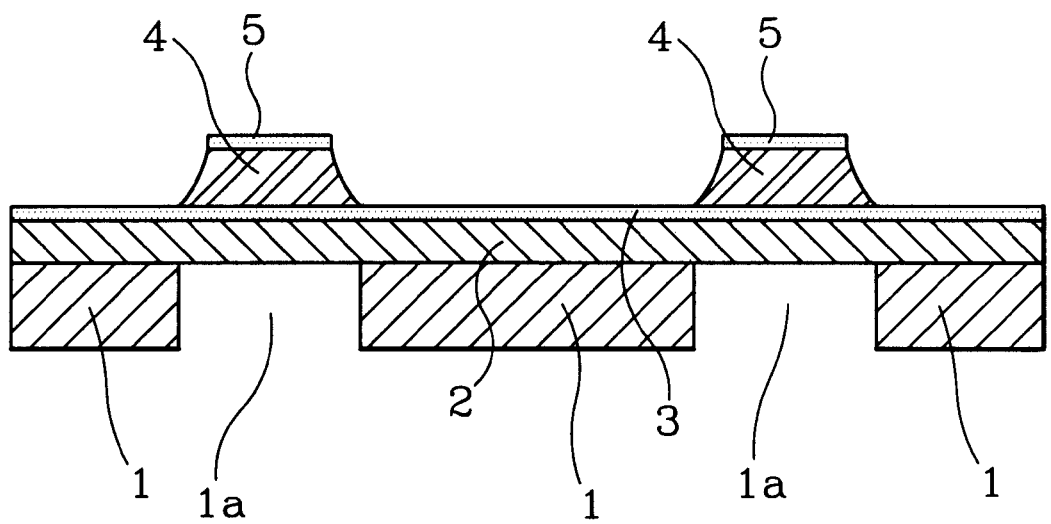

Thereafter, the chamber plate 1 is etched by an etchant while using the patterned photoresist film 6 as a mask, thereby forming a plurality of uniformly spaced solution chambers 1a in the chamber plate 1, as shown in FIG. 12D. Thus, a microactuator having a desired structure is fabricated.

As apparent from the above embodiments, the present invention is mainly characterized in that the fabrication of a microactuator for an inkjet head, which has a multi-layer structure, involves use of an etching process upon patterning a part of constituting layers of the multi-layer structure, in particular, at least an oxide piezoelectric layer.

Figure 13:
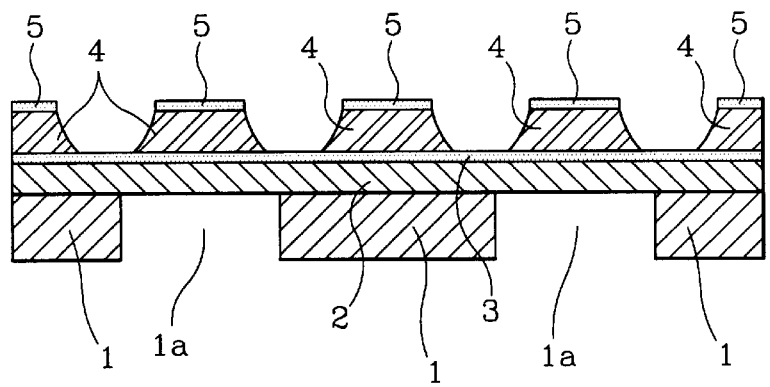
FIG. 13 is a cross-sectional view illustrating another embodiment of the present invention in which oxide piezoelectric elements having a pattern different from those in the above embodiments are formed.

Although the oxide piezoelectric elements 4 are arranged on the vibrating plate 2 in such a fashion that they are vertically and centrally aligned with the solution chambers 1a in the above mentioned embodiments of the present invention, additional oxide piezoelectric elements 4 may also be arranged on portions of the vibrating plate 2 vertically and centrally aligned with portions of the chamber plate 1 disposed between adjacent solution chambers 1a, respectively, as shown in FIG. 13.

The structure of FIG. 13 can be fabricated by etching the oxide piezoelectric sheet 4 with a narrow etching width. Under this condition, oxide piezoelectric elements having the same shape are formed at positions each defined between adjacent solution chambers 1a, as well as at positions respectively defined over the solution chambers 1a. Where such an etching process using a narrow etching width is used, several advantages are obtained in accordance with etching characteristics as shown in FIG. 14.

Figure 14:
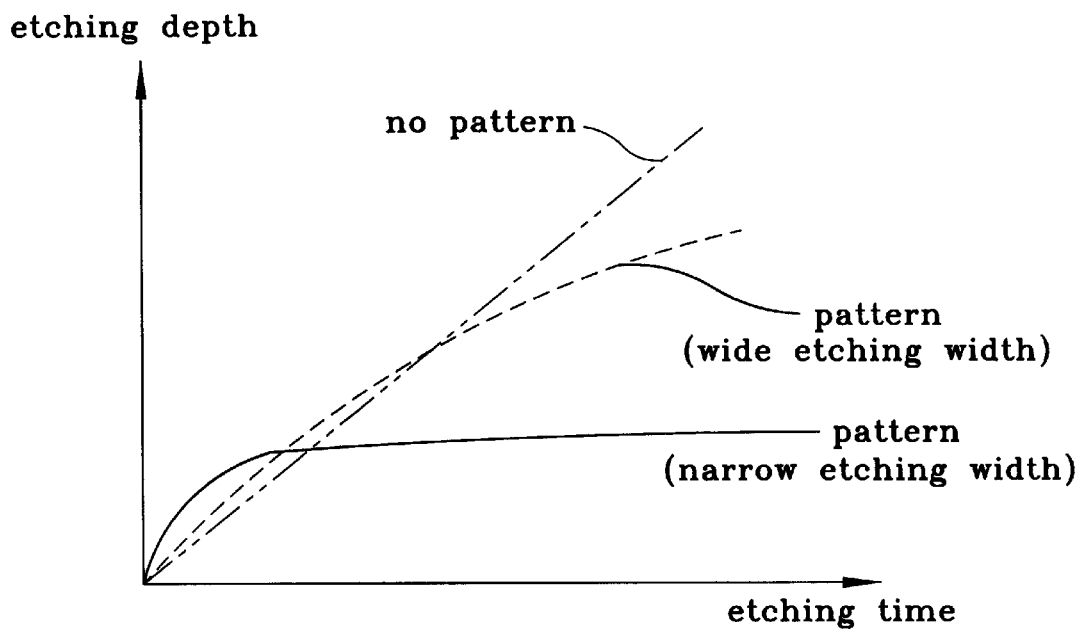
FIG. 14 is a graph depicting the relationship between etching time and etching depth depending on etching area.

That is, where the oxide piezoelectric sheet 4 is patterned in accordance with an etching process using a narrow etching width, the patterning can be economically achieved within a reduced etching time because the area to be etched is reduced, as shown in FIG. 14. Moreover, there is no or little loading effect. This results in a superior repeatability.

In this case, the etching depth is also automatically adjusted. That is, a self-restriction effect is provided. In the structure of FIG. 13, there is no cross talk occurring between adjacent chambers 1a. Accordingly, it is possible to increase the intrinsic and discharge frequencies of each chamber 1a. This results in an improvement in performance.

Figure 15:
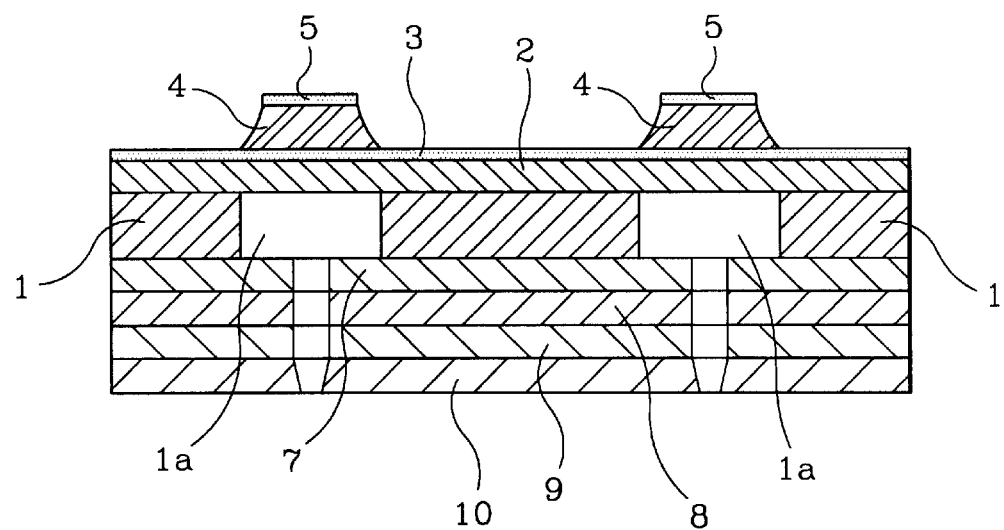
FIG. 15 is a cross-sectional view illustrating a multi-layer structure laminated over the lower surface of a chamber plate in a microactuator fabricated in accordance with the present invention.
Figure 16:
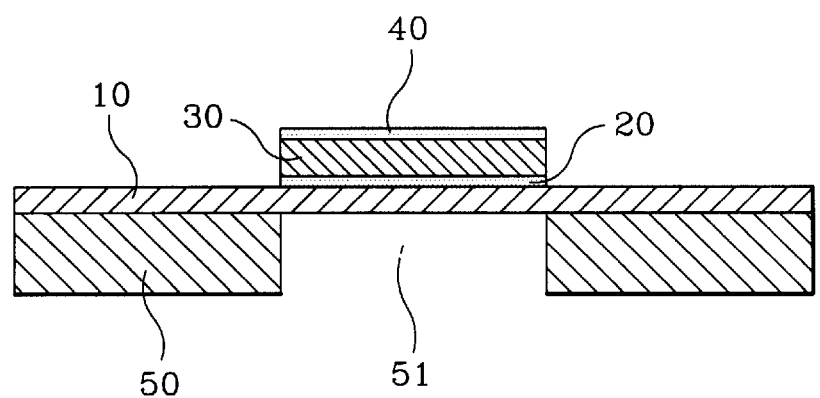
FIG. 16 is a cross-sectional view illustrating the structure of a typical microactuator fabricated in accordance with a conventional method.

In the microactuator fabricated in accordance with one of the above mentioned embodiment, a restrictor plate 7, a channel plate 8, a reservoir plate 9, and a nozzle plate 10 may be entirely or partially laminated over the lower surface of the chamber plate 1, in this order, as shown in FIG. 15.

Preferably, the vibrating plate 2 is comprised of a metal thin plate having a thickness of 3 to 200 $\mu$m or a ceramic thin plate having a thickness of 5 to 300 $\mu$m. The chamber plate 1 attached to the vibrating plate 2 typically has a thickness of 50 to 1,000 $\mu$m.

Where a metal thin plate is used for the vibrating plate 2, it may include a stainless steel thin plate containing chromium in an amount of 10 to 30% and iron in an amount of 70 to 90%, or a thin plate containing nickel, chromium, and titanium in a total amount of 90% or more. In particular, the metal thin plate is partially wet-etched to have a desired size. Alternatively, the metal thin plate may be fabricated using a pressing process to have a desired size. The metal thin plate may also be formed on a separate substrate, using an electro forming process.

Where a ceramic thin plate is used for the vibrating plate 2, it may include a thin plate containing a zirconium oxide ($ZrO_2$), an aluminum oxide ($Al_2O_3$), and a silicon dioxide ($SiO_2$) in a total amount of 80% or more. The ceramic thin plate may also be fabricated by forming a slurry containing oxide powder into the form of a green sheet, and sintering the green sheet. Alternatively, the ceramic thin plate may be fabricated by shaping the slurry to have a desired shape, and then sintering the shaped slurry.

Preferably, the lower electrode 3 is made of a conductive metal or precious metal. The lower electrode 3 is formed on the vibrating plate 2 using a screen printing process or a vapor deposition process such as a sputtering or evaporation process.

The oxide piezoelectric sheet 4, which is separately prepared, is bonded to the lower electrode 3 by means of an adhesive exhibiting a conductivity. Thus, the lower electrode 3 can be externally connected in an easy manner.

Meanwhile, where the vibrating plate 2 is made of a conductive metal material, it is possible to eliminate the lower electrode 3. In this case, the oxide piezoelectric sheet 4, which is separately formed, is directly bonded to the vibrating plate 2. Alternatively, the oxide piezoelectric sheet 4 may be directly formed on the vibrating plate 2 using a screen printing process.

It is preferred that the vibrating plate and adhesive used have a high acid resistance so that they are not etched during the pattering of the oxide piezoelectric sheet using an etchant which mainly contains acid.

The etchant, which is used in the etching process, may have a liquid or gaseous phase. The etching process using a liquid etchant is called a "wet etching process" whereas the etching process using an etchant of a gaseous phase, in particular, a plasma gas phase, is called a "dry etching process".

Both the wet and dry etching processes can be used upon etching the electrode layer to form upper electrodes and upon etching the oxide piezoelectric sheet to form oxide piezoelectric elements. However, it is preferred that the dry etching process be used in the formation of upper electrodes, rather than in the formation of oxide piezoelectric elements. This is because the dry etching process is mainly applied to thin films having a smaller thickness.

The oxide piezoelectric sheet 4, which is bonded to the vibrating plate 2 or lower electrode 3, has the form of a thin plate having a thickness of about 5 to 300 $\mu$m. The oxide piezoelectric sheet 4 may be formed by forming a green sheet having a thin plate shape, and then sintering the green sheet. Alternatively, the oxide piezoelectric sheet 4 may be comprised of a thin plate sliced from a bulk and then subjected to a lapping process at upper and lower surfaces thereof.

The oxide piezoelectric sheet 4 has a perovskite crystalline structure containing oxygen, and metal elements including lead and barium in an amount of 40 to 60% based on the total amount of the metal elements. Typically, the piezoelectric material used in this case contains PZT (Pb ($ZrTi$)$O_3$), PLZT($Pb_{1-x}La_x(ZrTi)O_3$), PZTPMN(Pb(MnNb)$O_3$), $PbTiO_3$, or $BaTiO_3$ in an amount of 95% or more. The piezoelectric material may additionally contain strontium (Sr), manganese (Mn), and niobium (Nb) in an amount of about 5% or less.

The photoresist film 6, which is coated over the lower electrode 3 or the oxide piezoelectric sheet 4, is laminated by spin coating a photoresist material of a liquid phase onto the target at a rotating speed of about 4,000 rpm, or laminating a photoresist material, in the form of a dry film, over the target.

The photoresist film 6 coated is soft-baked at a temperature of about 70 to 100° C., exposed to light by use of a mask having a desired pattern, and then developed.

The photoresist film 6 may be made, selectively using a negative photoresist material or a positive photoresist material. For the selected photoresist material, the developing solution and rinsing solution to be used are appropriately determined.

Preferably, a negative photoresist material is used because such a negative photoresist material exhibits a high acid resistance, taking into consideration the fact that the oxide piezoelectric sheet is patterned using an etching process.

Where a microactuator is fabricated in accordance with the above mentioned method, it can have oxide piezoelectric elements and upper electrodes having respective patterns capable of achieving an optimum squirting efficiency. Furthermore, an optional variation in those patterns is possible. Accordingly, a relatively increased degree of freedom in design is obtained.

In conventional cases, an expensive punching machine should be used for the patterning of an oxide piezoelectric sheet to form oxide piezoelectric elements of a desired pattern and the patterning of an electrode layer to form upper electrodes of a desired pattern. In accordance with the present invention, however, such patterning processes are chemically achieved. Accordingly, an easy fabrication can be achieved without using any expensive equipment. In conventional cases, a variation in patterns involves an expensive equipment replacement or addition. In accordance with the present invention, however, an inexpensive mask replacement is only required for such a variation in patterns. Therefore, the present invention provides an advantage in terms of economical purposes.

In particular, the patterning method according to the present invention provides a superior accuracy over the mechanical patterning method used in conventional cases. Therefore, the method of the present invention is most ideal in forming micro patterns. Accordingly, the resulting actuator can exhibit an improved performance even at micro portions thereof.

Moreover, it is possible to achieve a reduction in processing time while achieving an improvement in productivity, which is advantageous in terms of mass production, as compared to the mechanical processing method used in conventional cases.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a microactuator used for an inkjet head comprising the steps of:

sequentially laminating a lower electrode and an oxide piezoelectric sheet over a vibrating plate formed integrally with a chamber plate having a plurality of uniformly spaced solution chambers;

coating a first photoresist film over an upper surface of said oxide piezoelectric sheet, and removing unnecessary portions of said first photoresist film while partially exposing said upper surface of the oxide piezoelectric sheet among said removed portions of the first photoresist film;

coating an electrode layer to a desired thickness over said exposed upper surface of said oxide piezoelectric sheet and an upper surface of said first photoresist film remaining on said oxide piezoelectric sheet;

removing said remaining first photoresist film by use of a rinsing solution while simultaneously removing portions of said electrode layer disposed over said remaining first photoresist film, thereby forming upper electrodes while partially exposing an upper surface of the oxide piezoelectric sheet among the upper electrodes;

coating a second photoresist film over respective upper surfaces of said upper electrodes and said exposed upper surface of said oxide piezoelectric sheet;

removing unnecessary portions of said second photoresist film not covering said upper electrodes while allowing remaining portions of said second photoresist film to have a larger area that said upper electrodes associated therewith, respectively;

patterning said oxide piezoelectric sheet by use of an etchant while using said second photoresist film remaining on said upper electrodes as a mask, thereby forming oxide piezoelectric elements; and removing said remaining second photoresist film.

2. The method in accordance with claim 1, wherein said vibrating plate is comprised of a metal thin plate having a thickness of 3 to 200 $\mu$m.

3. The method in accordance with claim 1, wherein said vibrating plate is comprised of a ceramic thin plate having a thickness of 5 to 300 $\mu$m.

4. The method in accordance with claim 3, wherein said ceramic thin plate is formed by forming a slurry containing oxide powder into a green sheet, and then sintering said green sheet.

5. The method in accordance with claim 1, wherein said oxide piezoelectric sheet is formed by forming an oxide piezoelectric material into a thin plate having a thickness of 10 to 300 $\mu$m, and then sintering said thin plate.

6. The method in accordance with claim 1, wherein said oxide piezoelectric sheet is etched, at said patterning step thereof, with a narrow etching width so that said oxide piezoelectric elements are disposed on portions of said vibrating plate vertically and centrally aligned with said solution chambers, and portions of said vibrating plate vertically and centrally aligned with portions of said chamber plate each corresponding to a region defined between adjacent ones of said solution chambers, respectively.

7. The method in accordance with claim 1, wherein said oxide piezoelectric sheet is wet-etched, at said patterning step thereof, using an etching solution.

8. The method in accordance with claim 1, wherein said oxide piezoelectric sheet is dry-etched, at said patterning step thereof, using a plasma phase etching gas.

* * * * *